US012453146B2

(12) United States Patent
Xie et al.

(10) Patent No.: US 12,453,146 B2
(45) Date of Patent: Oct. 21, 2025

(54) EPI GROWTH UNIFORMITY WITH SOURCE/DRAIN PLACEHOLDER

(71) Applicant: INTERNATIONAL BUSINESS MACHINES CORPORATION, Armonk, NY (US)

(72) Inventors: Ruilong Xie, Niskayuna, NY (US); Daniel Schmidt, Niskayuna, NY (US); Tsung-Sheng Kang, Ballston Lake, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 562 days.

(21) Appl. No.: 17/934,226

(22) Filed: Sep. 22, 2022

(65) Prior Publication Data
US 2024/0105768 A1 Mar. 28, 2024

(51) Int. Cl.
*H10D 62/10* (2025.01)
*H01L 23/48* (2006.01)
*H10D 30/01* (2025.01)
*H10D 30/43* (2025.01)
*H10D 30/67* (2025.01)
(Continued)

(52) U.S. Cl.
CPC ......... *H10D 62/121* (2025.01); *H01L 23/481* (2013.01); *H10D 30/014* (2025.01); *H10D 30/43* (2025.01); *H10D 30/6757* (2025.01); *H10D 62/151* (2025.01); *H10D 84/0128* (2025.01); *H10D 84/013* (2025.01); *H10D 84/038* (2025.01)

(58) Field of Classification Search
CPC ............... H10D 84/038; H10D 84/013; H10D 84/0149; H10D 62/121; H10D 30/6735; H10D 62/116; H01L 23/481
See application file for complete search history.

(56) References Cited

U.S. PATENT DOCUMENTS 9,711,644 B2   7/2017  Pawlak et al.
10,074,571 B1  9/2018  Greene et al.
(Continued)

FOREIGN PATENT DOCUMENTS

EP   3945560 A1   2/2022

OTHER PUBLICATIONS

International Search Report; International Application No. PCT/CN2023/094960; International Filing Date: May 18, 2023; Date of mailing: Aug. 28, 2023 ; 9 pages.
(Continued)

*Primary Examiner* — Changhyun Yi
(74) *Attorney, Agent, or Firm* — CANTOR COLBURN LLP; Matt Zehrer

(57) ABSTRACT

A semiconductor device includes a nanosheet stack on a substrate. A first source/drain is on a first side of the nanosheet stack and a second source/drain is on an opposing side of the nanosheet stack. A backside contact includes a first contact end on a first end of the first source/drain and an opposing second contact end in electrical communication with a backside power distribution network. A frontside contact includes a first contact end on a first end of the second source/drain and an opposing second contact end in electrical communication with a backend of line (BEOL) interconnect. A placeholder extends from an opposing second end of the second source/drain.

18 Claims, 19 Drawing Sheets

(51) Int. Cl.
*H10D 62/13* (2025.01)
*H10D 84/01* (2025.01)
*H10D 84/03* (2025.01)

(56) References Cited

U.S. PATENT DOCUMENTS

| | | | |
|---|---|---|---|
| 10,692,768 | B1 | 6/2020 | Rubin et al. |
| 11,121,086 | B2 | 9/2021 | Hiblot et al. |
| 11,257,764 | B2 | 2/2022 | Hiblot et al. |
| 2017/0194143 | A1* | 7/2017 | Balakrishnan .... H01L 21/02603 |
| 2018/0108526 | A1* | 4/2018 | Mitard ................... H10D 30/43 |
| 2018/0366324 | A1 | 12/2018 | Cao et al. |
| 2019/0057867 | A1* | 2/2019 | Smith ............... H01L 21/02603 |
| 2020/0075771 | A1 | 3/2020 | Kobrinsky et al. |
| 2021/0111115 | A1 | 4/2021 | Morrow et al. |
| 2021/0134721 | A1 | 5/2021 | Chiang et al. |
| 2021/0202385 | A1 | 7/2021 | Huang et al. |
| 2021/0305252 | A1 | 9/2021 | Chiang et al. |
| 2021/0305381 | A1 | 9/2021 | Chiang et al. |
| 2021/0343639 | A1* | 11/2021 | Wang ................ H01L 21/76897 |
| 2021/0351303 | A1 | 11/2021 | Ju et al. |
| 2021/0366907 | A1 | 11/2021 | Liao et al. |
| 2021/0376071 | A1 | 12/2021 | Liu et al. |
| 2021/0376093 | A1 | 12/2021 | Chu et al. |
| 2021/0376094 | A1 | 12/2021 | Lin et al. |
| 2021/0408247 | A1 | 12/2021 | Yu et al. |
| 2022/0069117 | A1 | 3/2022 | Yu et al. |
| 2022/0238659 | A1 | 7/2022 | Lee et al. |
| 2022/0344464 | A1* | 10/2022 | Chiu ....................... H10D 30/43 |

OTHER PUBLICATIONS

Chu, "Ge/Si multilayer epitaxy and removal of dislocations from Ge-nanosheet-channel MOSFETs", nature portfolio, Scientific Reports; 2022; 10p.

Intellectual Property Office, Patents Act 1977: Examination Report under Section 18(3), May 20, 2025, 10 Pages, GB Application No. 2504493.4.

* cited by examiner

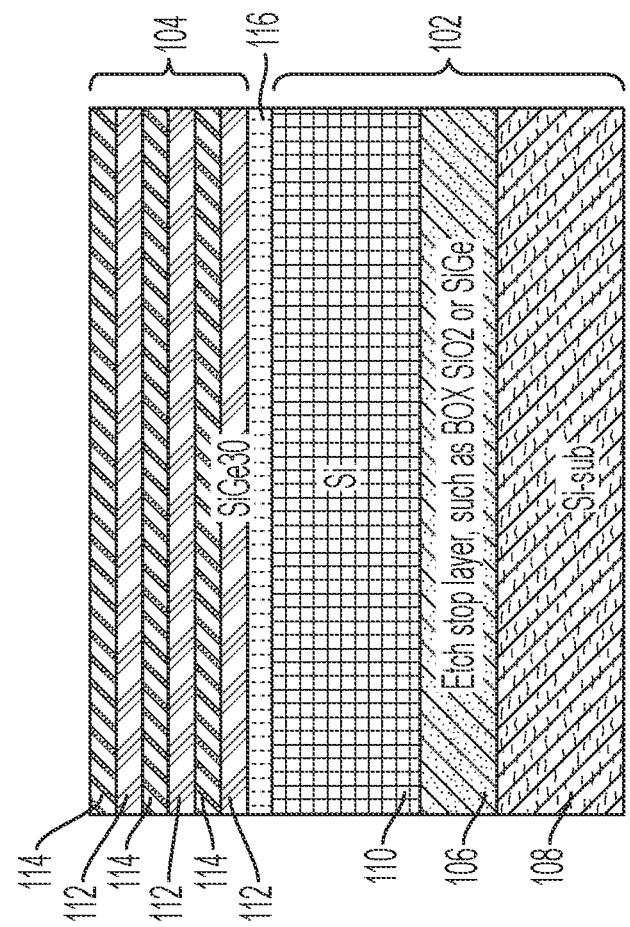
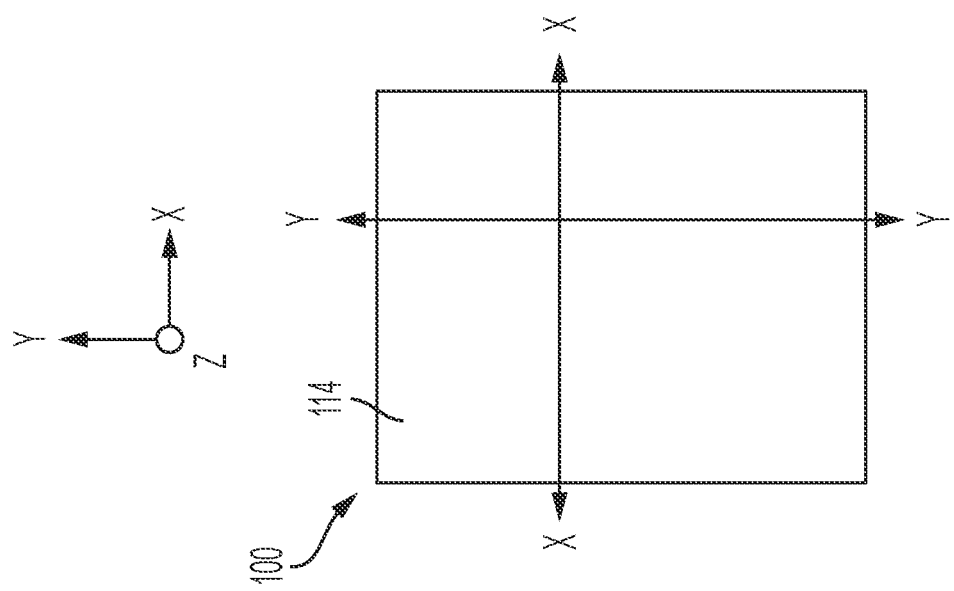
FIG. 1B
FIG. 1A

Taken along line Y-Y

Taken along line X-X

Taken along line Y-Y

Taken along line X-X

Taken along line Y-Y

Taken along line X-X

Taken along line Y-Y

Taken along line X-X

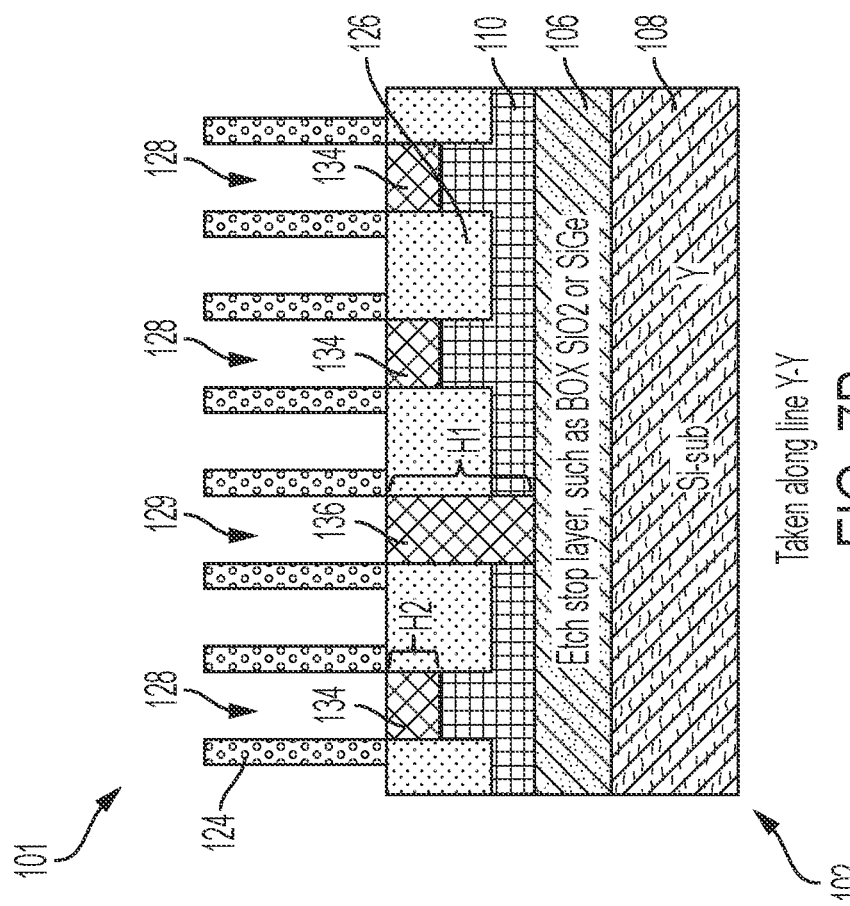
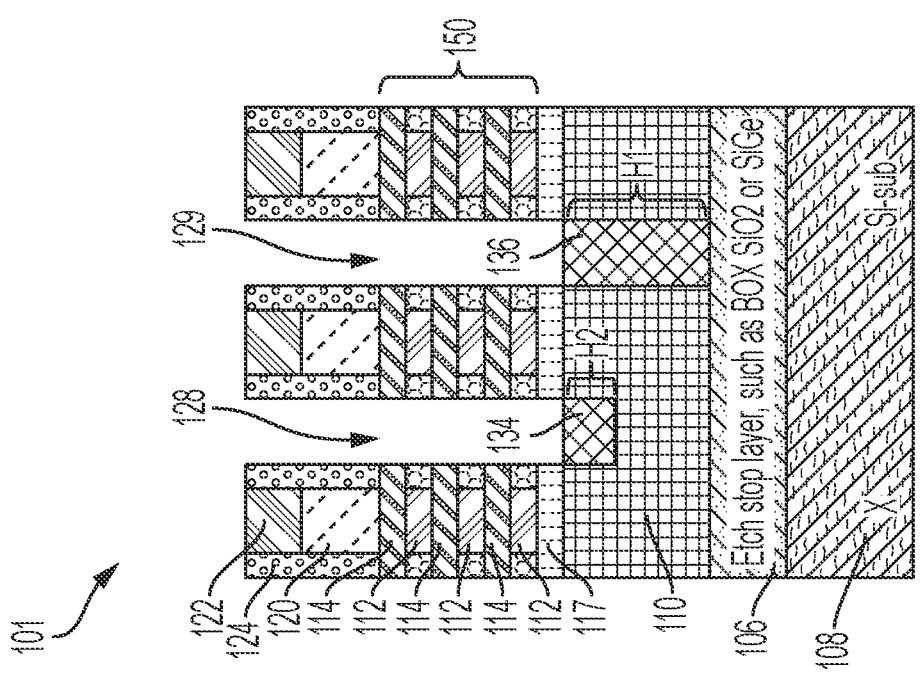

Taken along line Y-Y

Taken along line X-X

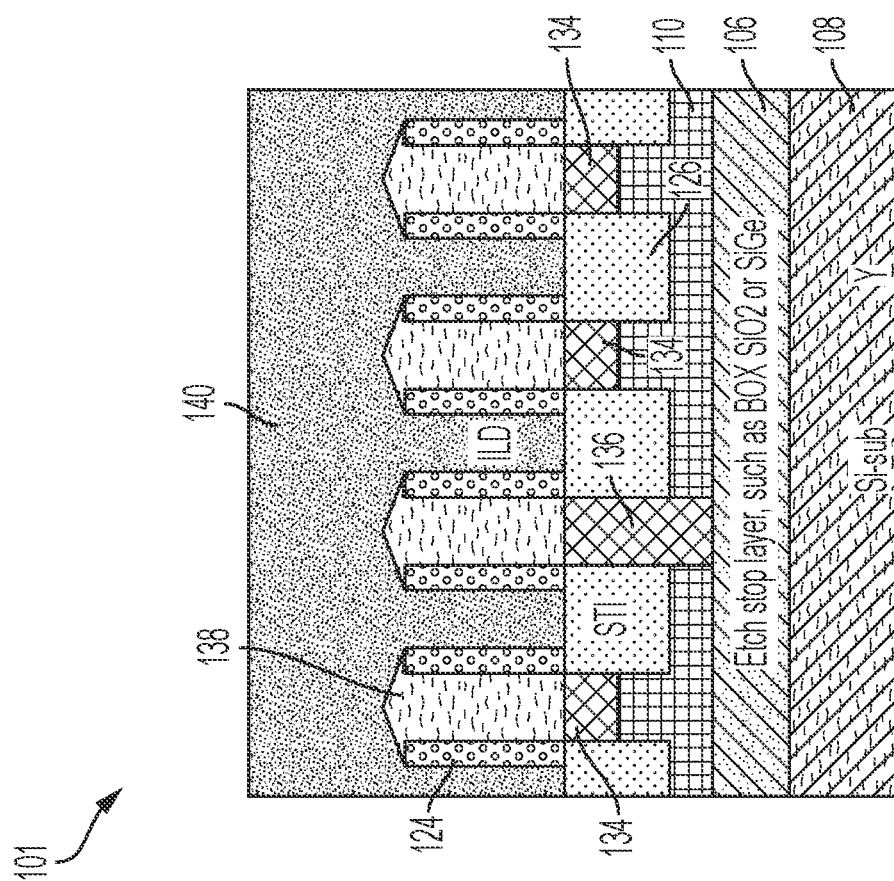
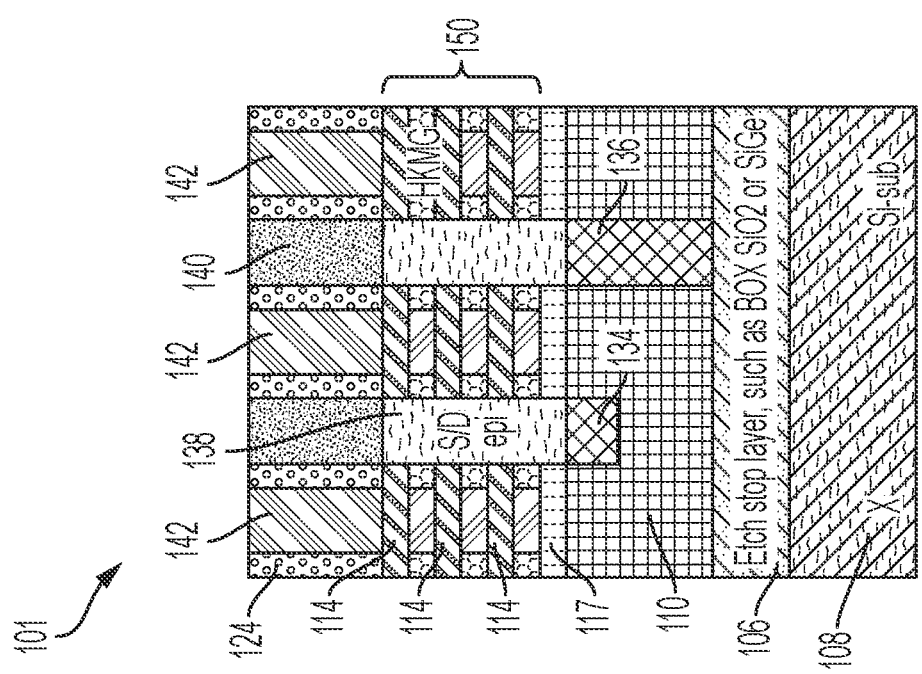
FIG. 9B Taken along line Y-Y
FIG. 9A Taken along line X-X

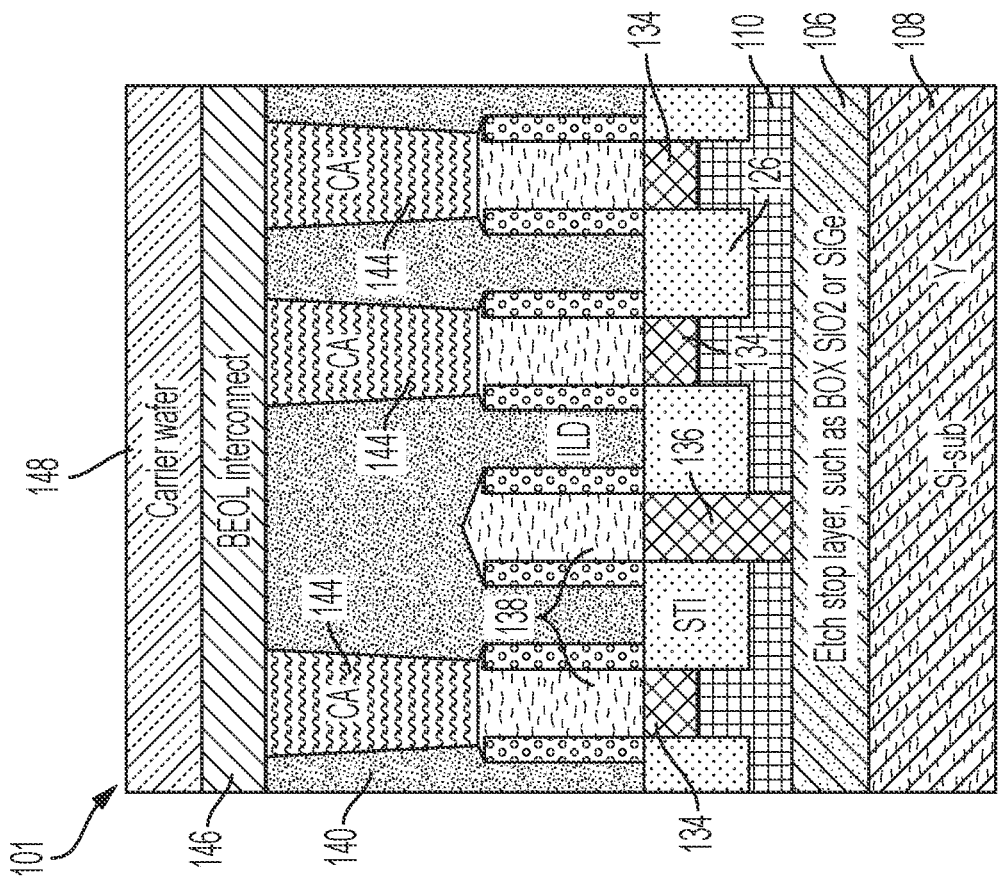
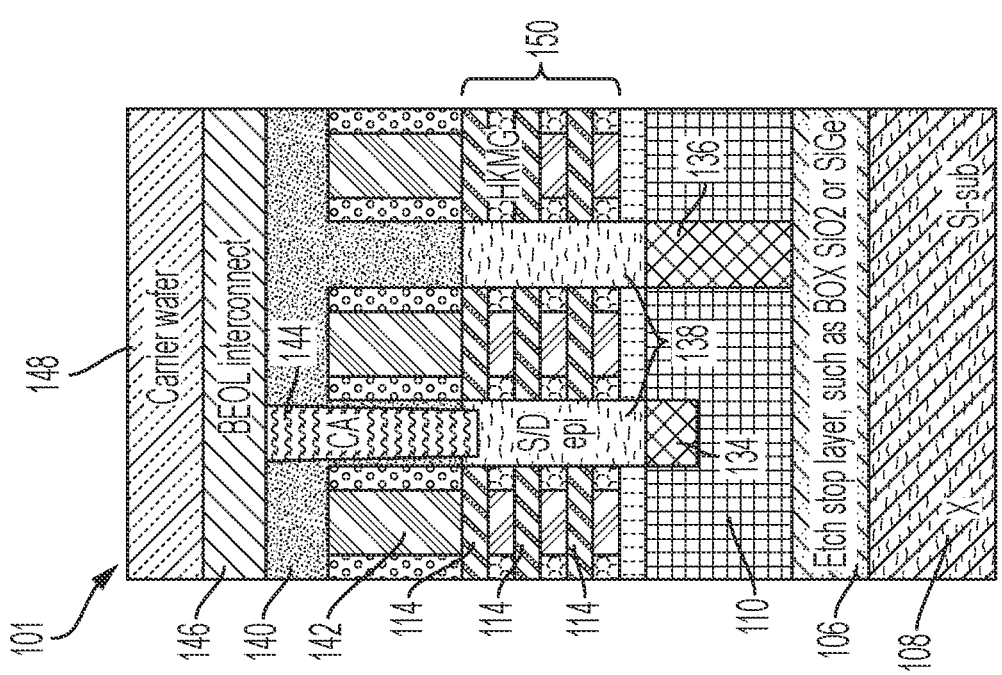

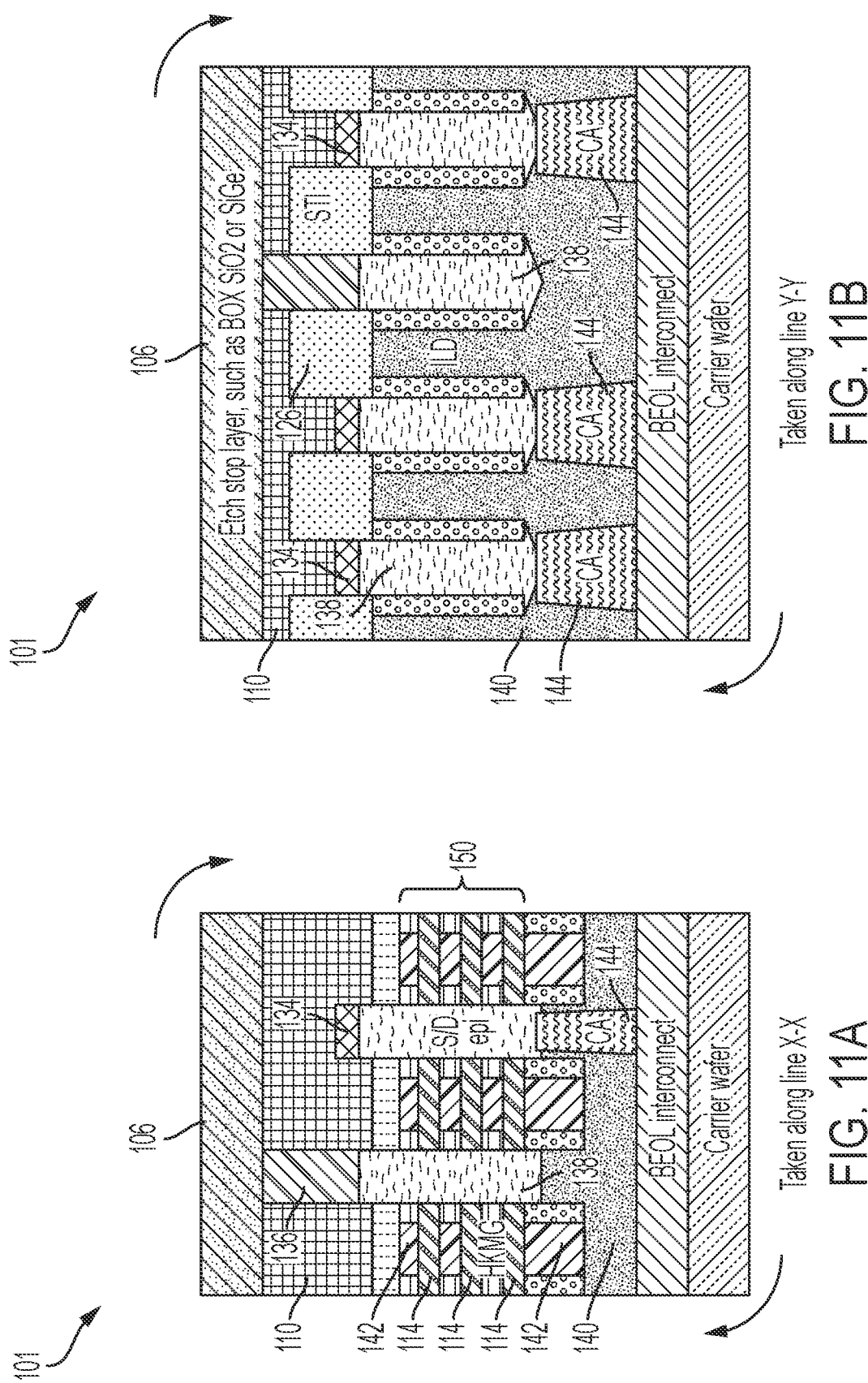

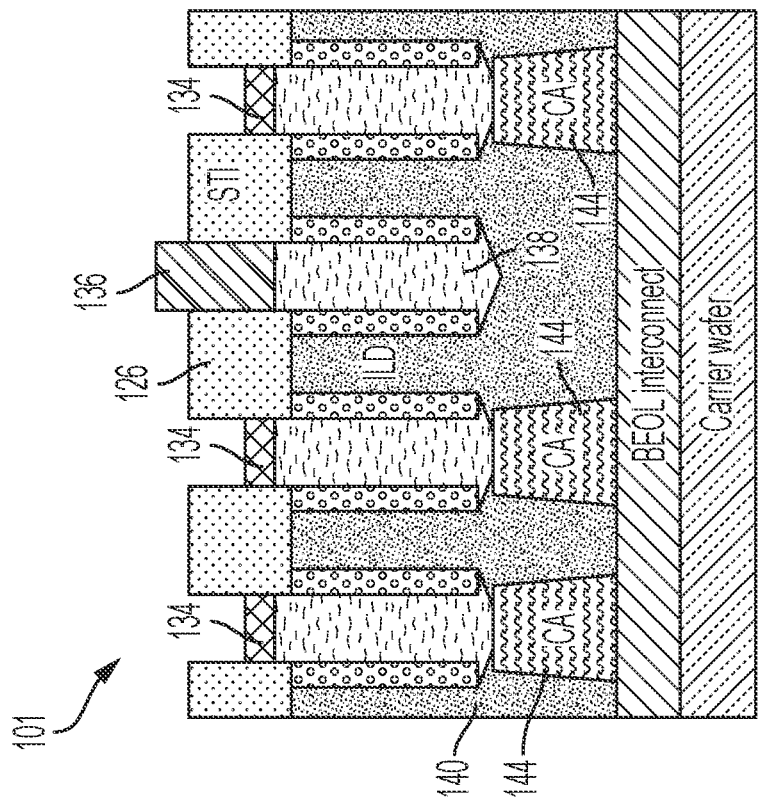
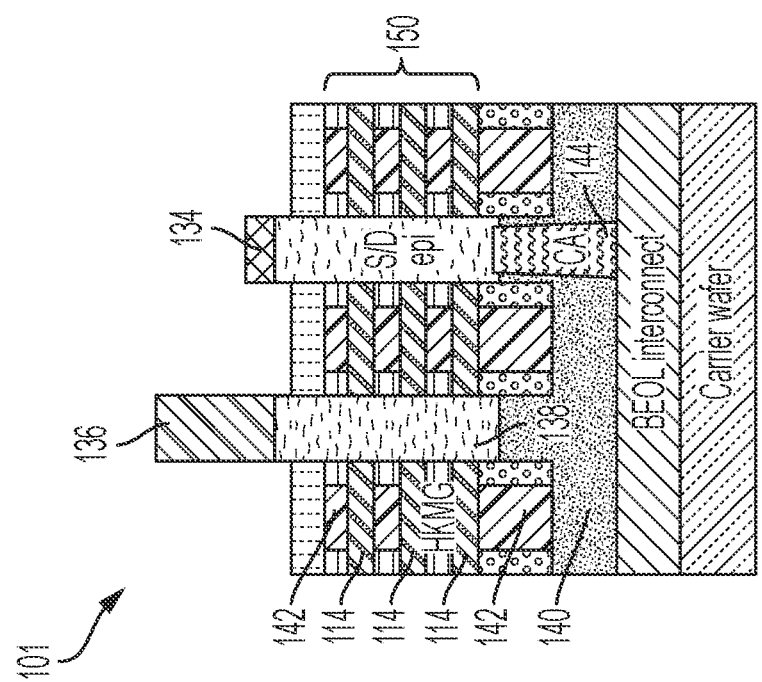
FIG. 12A (Taken along line X-X)
FIG. 12B (Taken along line Y-Y)

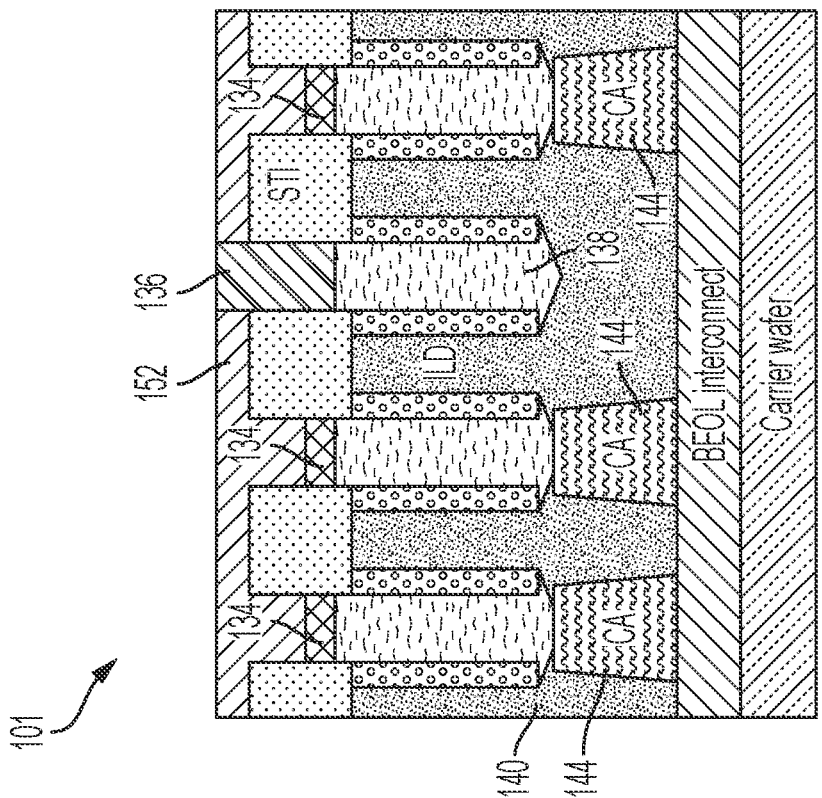
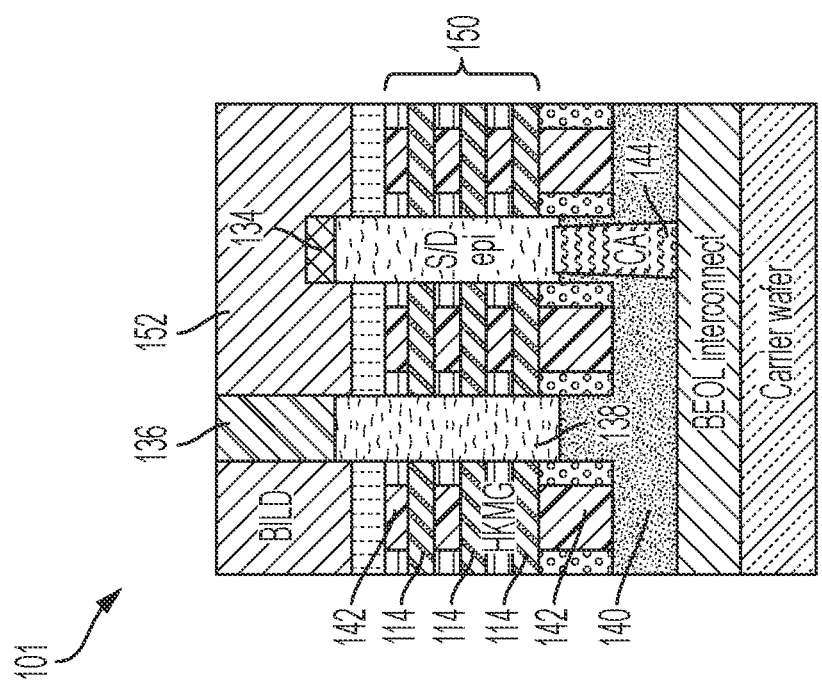

Taken along line Y-Y

Taken along line X-X

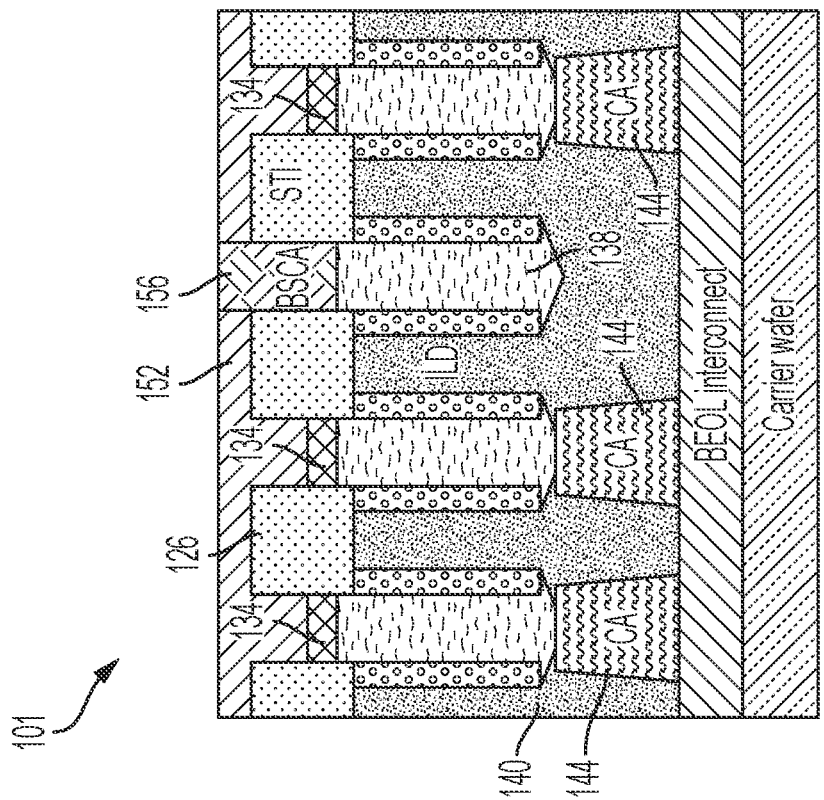
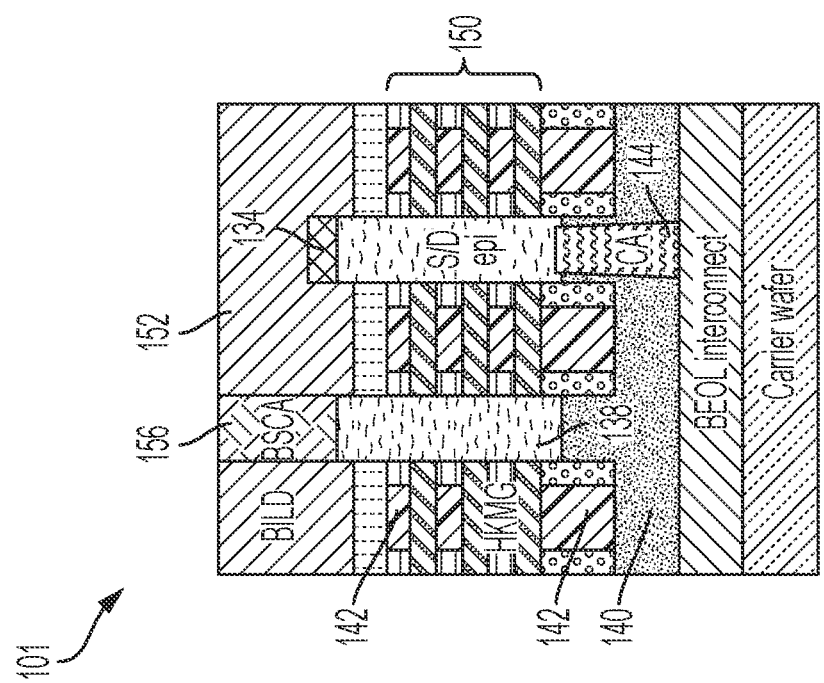

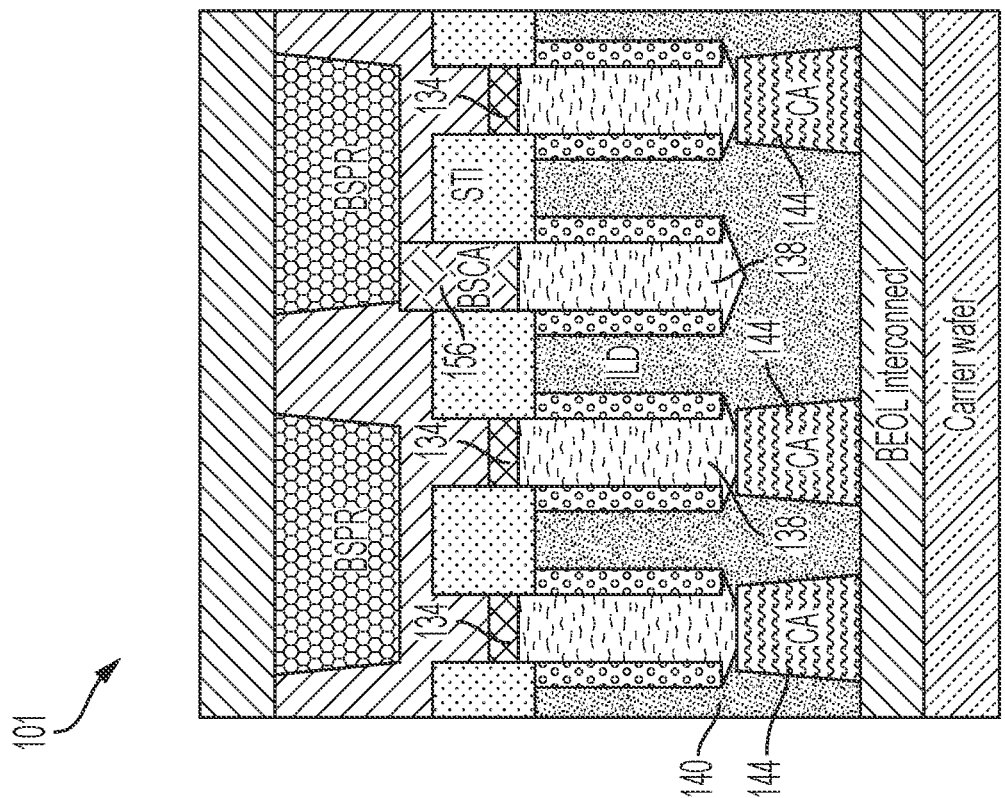

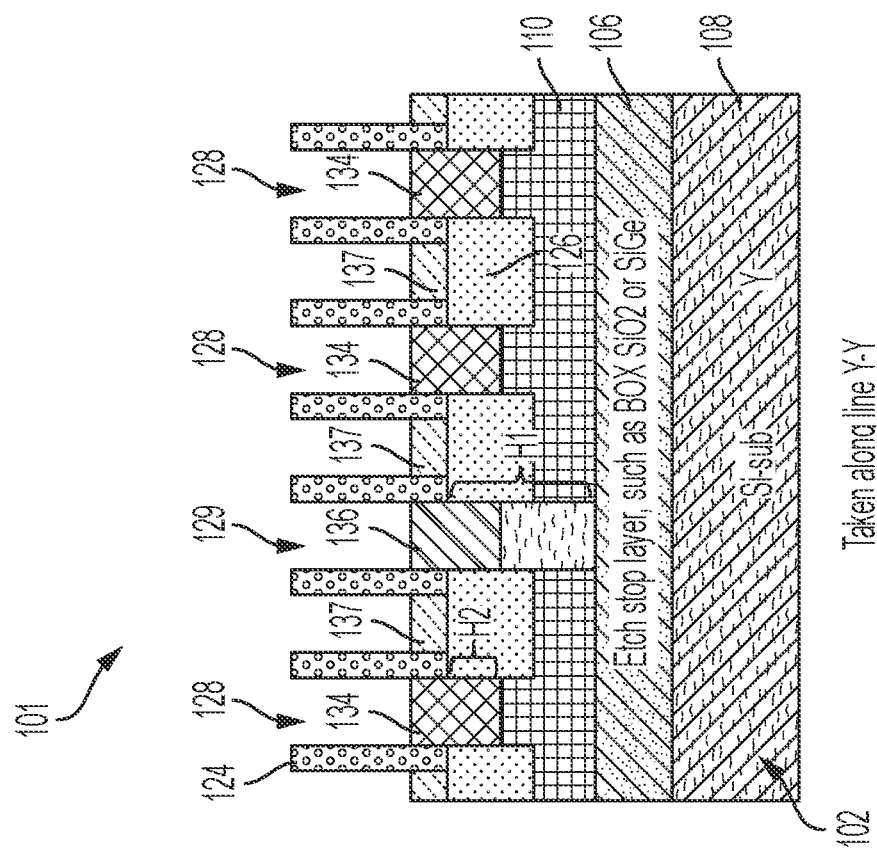
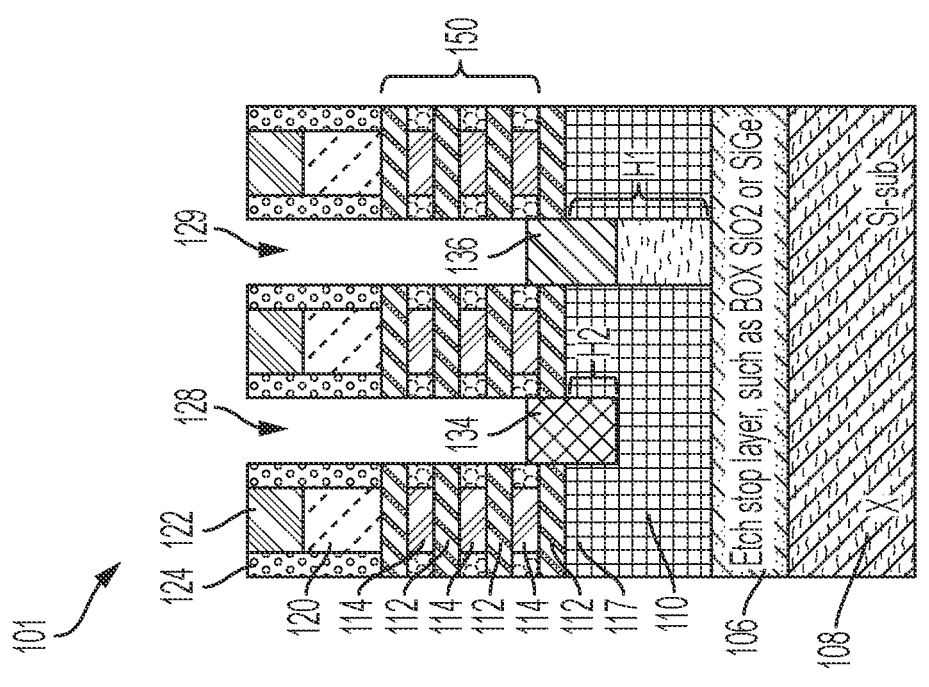

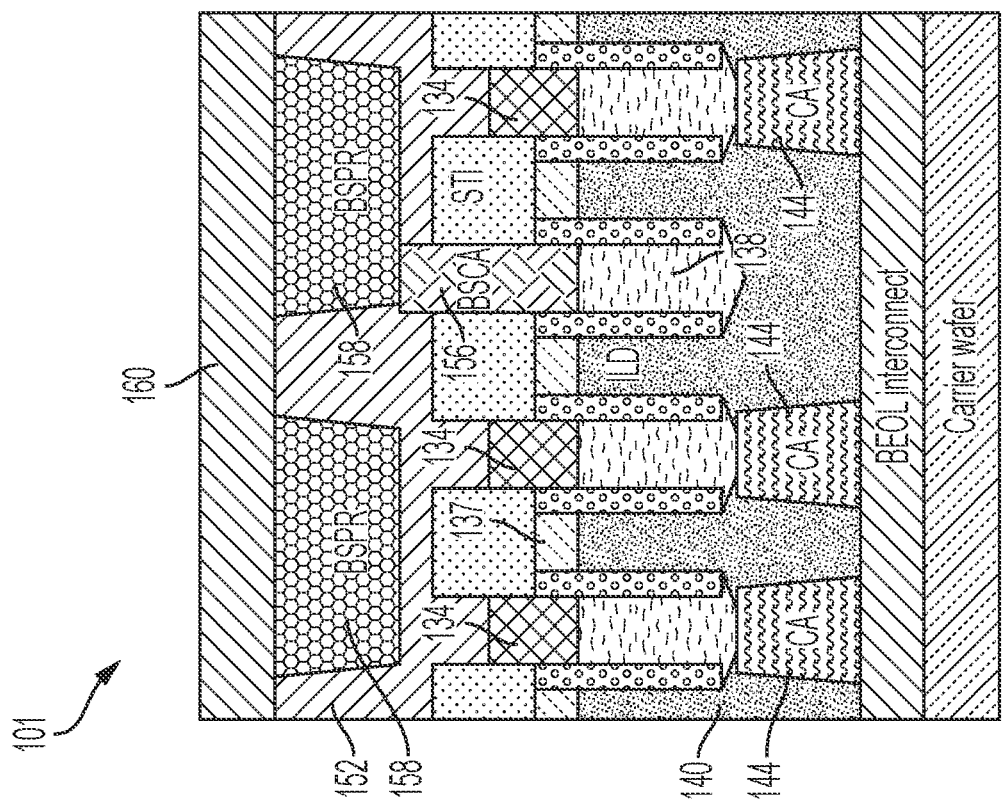
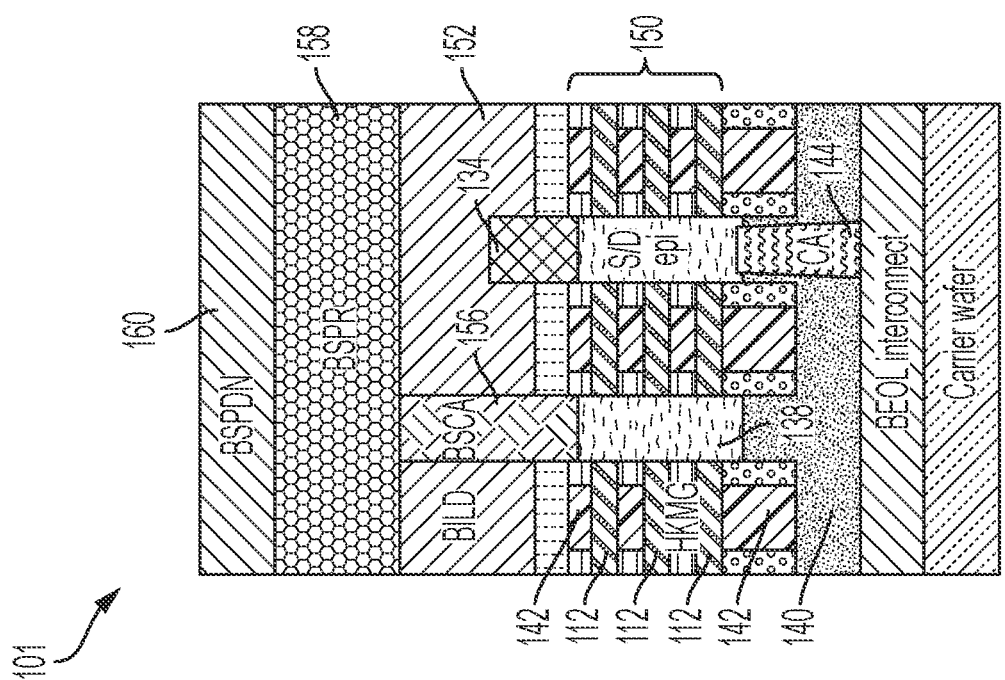

EPI GROWTH UNIFORMITY WITH SOURCE/DRAIN PLACEHOLDER

BACKGROUND

The present invention generally relates to fabrication methods and resulting structures for semiconductor devices, and more specifically, to fabrication methods and resulting semiconductor devices having improved epitaxy growth uniformity.

Spacings between various elements in a semiconductor device are shrinking as semiconductor footprints continue to decrease. Gate pitches (spacing), for example, continue to shrink as semiconductor device footprints are reduced, which causes concerns involving undesirable contact between the source/drain contacts and the gate. Furthermore, three dimensional transistors, such as those formed on fin-type active regions, are often desired for enhanced device performance. Those three-dimensional field effect transistors (FETs) formed on fin-type active regions are also referred to as FinFETs. Other three-dimensional field-effect transistors include gate-all-around (GAA) FETs. Those FETs require a narrow fin width for short channel control, which leads to smaller source/drain regions than those of planar FETs. These narrowed fin widths reduce alignment margins and can cause issues for further shrinking device pitches and increasing packing density. Along with the reduced scaling of device sizes, there is a trend to form power lines on the backside of the substrate. However, the existing backside power rails still face various challenges including shorting, leakage, routing resistance, alignment margins, layout flexibility, and packing density.

Direct Backside Contact (DBC) is an attractive solution for future CMOS scaling because it effectively provides wiring options in backside of the wafer. In terms of semiconductor fabrication, the DBC process removes concerns pertaining to narrow space formations in the front end of line (FEOL) and/or middle of line (MOL) and can be applied on any cell-to-cell space. The DBC process also does not require performance comprising high aspect ratio (AR) backside power rails (VBPR) typically found in traditional non-DBC bonding techniques.

DBC fabrication processes typically involve forming a backside source/drain contact that is self-aligned to the underlying source/drain region. The self-aligned source/drain contact is achieved using a process that includes forming a deep trench in the source/drain region using lithography patterning and etching techniques. However, the deep trench material is not deposited at all portions beneath all the S/D regions. As a result, non-uniform source/drains may be formed that can reduce the performance of the semiconductor device.

SUMMARY

Embodiments of the present invention are directed to fabrication methods and resulting semiconductor devices, which implement source/drain placeholder elements that improve epitaxy growth uniformity. According to a non-limiting embodiment, a method comprises patterning a semiconductor nanosheet stack formed on semiconductor substrate to define a channel region between a first designated source/drain region and a second designated source/drain region. The method further comprises forming a first source/drain trench in a first portion of the semiconductor substrate located in the first designated source/drain channel region and forming a second source/drain trench in a second portion of the semiconductor substrate located in the second designated source/drain channel region. The method further comprises extending a depth of the second source/drain trench to define a deep trench while maintaining a depth of the first source/drain trench. The method further comprises forming a placeholder element in the first source/drain trench and a deep trench placeholder element in the deep trench, and forming a first source/drain on the placeholder element and a second source/drain on the deep trench placeholder element. The placeholder element formed in the first source/drain trench and the deep trench placeholder element formed in the deep trench allows for forming the first source/drain on the placeholder element and the second source/drain on the deep trench placeholder element having uniform profiles.

In addition to one or more of the features described herein, or as an alternative, further embodiments, the method includes forming an etch stop layer interposed between a lower portion of the semiconductor substrate and an upper portion of the semiconductor substrate.

In addition to one or more of the features described herein, or as an alternative, further embodiments, the method includes extending a depth of the second source/drain trench further includes etching an upper portion of the semiconductor substrate until stopping on the etch stop layer to define the depth of the deep trench.

In addition to one or more of the features described herein, or as an alternative, further embodiments, the method includes filling the first source/drain trench and the deep trench with a placeholder material.

In addition to one or more of the features described herein, or as an alternative, further embodiments, the method includes recessing the placeholder material until the upper surface of the placeholder material disposed in the first source/drain trench and the deep trench reach a targeted depth.

In addition to one or more of the features described herein, or as an alternative, further embodiments, the targeted depth forms a recessed surface of the placeholder material that is co-planar with an upper surface of the semiconductor substrate.

In addition to one or more of the features described herein, or as an alternative, further embodiments, the recessed surface of the placeholder material is formed at a targeted depth that is above an upper surface of the semiconductor substrate.

In addition to one or more of the features described herein, or as an alternative, further embodiments, the method includes forming a first source/drain and the second source/drain includes epitaxially growing the first source/drain from the placeholder element and epitaxially growing the second source/drain from the deep trench placeholder element.

In addition to one or more of the features described herein, or as an alternative, further embodiments, the method further includes replacing the deep trench placeholder element with a backside contact that establishes electrical connection with the second source drain.

In addition to one or more of the features described herein, or as an alternative, further embodiments, the method includes forming a gate around the channel region.

In addition to one or more of the features described herein, or as an alternative, further embodiments, the method includes forming the backside contact so that it is below a base of the gate.

In addition to one or more of the features described herein, or as an alternative, further embodiments, the method includes forming the backside contact so that it extends above a base of the gate.

According to another non-limiting embodiment, a semiconductor device includes a substrate extending along a first axis to define a length, a second axis orthogonal to the first axis to define a width, and a third axis orthogonal to the first and second axes to define a height. A nanosheet stack is on the substrate and defines channels of the semiconductor device. A first source/drain is on a first side of the nanosheet stack and a second source/drain is on an opposing side of the nanosheet stack. A backside contact includes a first contact end on a first end of the first source/drain and an opposing second contact end in electrical communication with a backside power distribution network. A frontside contact includes a first contact end on a first end of the second source/drain and an opposing second contact end in electrical communication with a backend of line (BEOL) interconnect. A placeholder extends along the third axis from an opposing second end of the second source/drain. The placeholder facilitates formation of uniform first and second source/drains.

In addition to one or more of the features described herein, or as an alternative, further embodiments, the first source/drain extends along the third axis to define a first source/drain height and the second source/drain extends along the third axis to define a second source/drain height matching the first source/drain height.

In addition to one or more of the features described herein, or as an alternative, further embodiments, the backside contact extends along the third axis between the first source/drain and the backside power distribution network to define a contact height, and the placeholder extends between the second source/drain and the backside power distribution network to define a placeholder height.

In addition to one or more of the features described herein, or as an alternative, further embodiments, the placeholder height is less than the contact height.

According to another non-limiting embodiment, a semiconductor device comprises a substrate extending along a first axis to define a length, a second axis orthogonal to the first axis to define a width, and a third axis orthogonal to the first and second axes to define a height. A nanosheet stack is on the substrate. The nanosheet stack includes a plurality of individual nanosheets defining channels of the semiconductor device. A gate stack is on the substrate and wraps around the individual nanosheets. A first source/drain is on a first side of the nanosheet stack and a second source/drain is on an opposing side of the nanosheet stack. A backside contact extends from a first contact end in electrical communication with a backside power distribution network to a second contact end located below the gate stack and contacting the first source/drain. A frontside contact extends from a first contact end in electrical communication with a backend of line (BEOL) interconnect to an opposing second contact end contacting a first end of the second source/drain. A placeholder extends along the third axis from a first end to an opposing second end located below the gate stack and contacts an opposing second end of the second source/drain. The placeholder facilitates formation of uniform first and second source/drains.

In addition to one or more of the features described herein, or as an alternative, further embodiments, the first source/drain extends along the third axis to define a first source/drain height and the second source/drain extends along the third axis to define a second source/drain height matching the first source/drain height.

In addition to one or more of the features described herein, or as an alternative, further embodiments, the backside contact extends along the third axis between the first source/drain and the backside power distribution network to define a contact height.

In addition to one or more of the features described herein, or as an alternative, further embodiments, the placeholder extends between the second source/drain and the backside power distribution network to define a placeholder height.

In addition to one or more of the features described herein, or as an alternative, further embodiments, the placeholder height is less than the contact height.

Other embodiments of the present invention implement features of the above-described devices/structures in methods and/or implement features of the methods in devices/structures. Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings presented herein.

FIGS. 1A-18B are a series of views illustrating a method of forming a semiconductor device according to exemplary embodiments of the present teachings, in which:

FIG. 1A is a top view of a starting substrate used to fabricate a semiconductor device following various fabrication processes;

FIG. 1B is a cross-section view illustrating the starting substrate of FIG. 1A in a first orientation taken along line X-X;

FIG. 7A is a cross-section view illustrating the semiconductor device in the first orientation following one or more subsequent fabrication processes;

FIG. 7B is a cross-section view illustrating the semiconductor device of FIG. 7A in the second orientation;

FIG. 9A is a cross-section view illustrating the semiconductor device in the first orientation following one or more subsequent fabrication processes;

FIG. 9B is a cross-section view illustrating the semiconductor device of FIG. 9A in the second orientation;

FIG. 10A is a cross-section view illustrating the semiconductor device in the first orientation following one or more subsequent fabrication processes;

FIG. 10B is a cross-section view illustrating the semiconductor device of FIG. 10A in the second orientation;

FIG. 11A is a cross-section view illustrating the semiconductor device in the first orientation following one or more subsequent fabrication processes;

FIG. 11B is a cross-section view illustrating the semiconductor device of FIG. 11A in the second orientation;

FIG. 12A is a cross-section view illustrating the semiconductor device in the first orientation following one or more subsequent fabrication processes;

FIG. 12B is a cross-section view illustrating the semiconductor device of FIG. 12A in the second orientation;

FIG. 13A is a cross-section view illustrating the semiconductor device in the first orientation following one or more subsequent fabrication processes;

FIG. 13B is a cross-section view illustrating the semiconductor device of FIG. 13A in the second orientation;

FIG. 15A is a cross-section view illustrating the semiconductor device in the first orientation following one or more subsequent fabrication processes;

FIG. 15B is a cross-section view illustrating the semiconductor device of FIG. 15A in the second orientation;

FIG. 16A is a cross-section view illustrating the semiconductor device in the first orientation following one or more subsequent fabrication processes; and FIG. 16B is a cross-section view illustrating the semiconductor device of FIG. 16A in the second orientation.

FIG. 17A is a cross-section view illustrating the semiconductor device of FIGS. 6A and 6B in the first orientation following one or more subsequent fabrication processes;

FIG. 17B is a cross-section view illustrating the semiconductor device of FIG. 17A in the second orientation;

FIG. 18A is a cross-section view illustrating the semiconductor device of FIGS. 17A and 17B in the first orientation following one or more subsequent fabrication processes; and FIG. 18B is a cross-section view illustrating the semiconductor device of FIG. 18A in the second orientation.

DETAILED DESCRIPTION

Figure 2B:
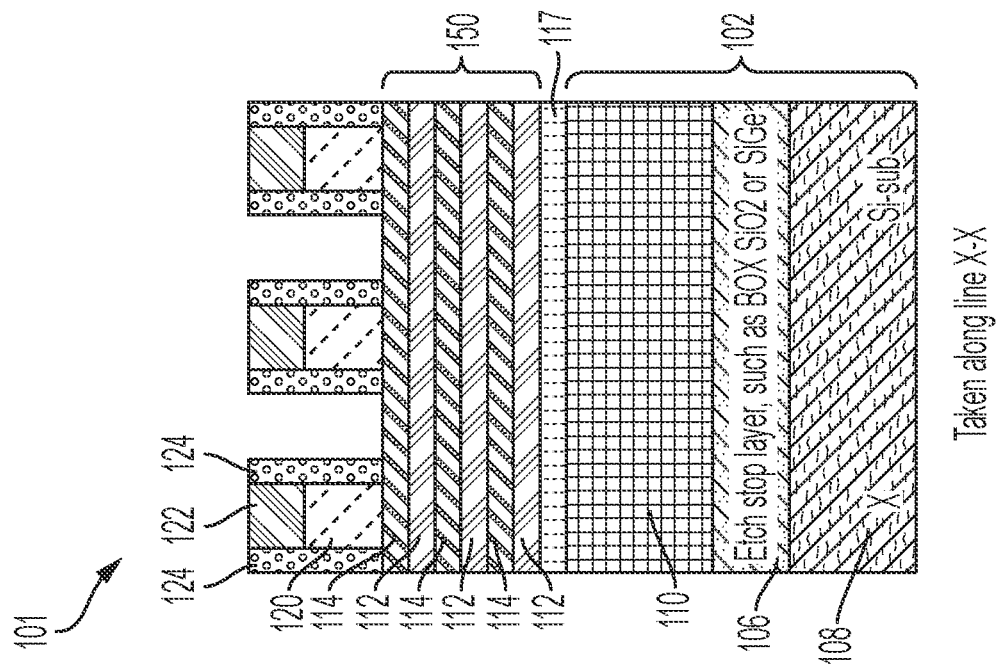
FIG. 2B is a cross-section view illustrating the semiconductor device in the first orientation.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that generally relevant to the present teachings, DBC fabrication can involve depositing a sacrificial placeholder material in a deep trench, followed by S/D epi formation over the sacrificial placeholder. However, the deep trenches and/or sacrificial material for sacrificial placeholder formation may not be formed beneath all S/D regions of the semiconductor device. As a result, non-uniform source/drains may be formed between growing an S/D epitaxy (epi) material from the top surface of the sacrificial placeholder and growing the source/drain epi over non-sacrificial placeholder region during the source/drain epi process.

Various non-limiting embodiments of the present invention solve the deficiencies of the conventional fabrication techniques discussed above by providing fabrication methods and resulting semiconductor devices that implement source/drain placeholder elements to improve epitaxy growth uniformity when forming the source/drains. The source/drain placeholder is formed in the source/drain trenches prior to performing the source/drain epi process such that the bottom surfaces of all the source/drain trenches are aligned. In this manner, uniform source/drains can be formed following the source/drain epi process.

Turning now to a more detailed description of aspects of the present invention, FIG. 1A is a top view of a starting semiconductor substrate 100 used to fabricate a semiconductor device described herein following various fabrication processes, and FIG. 1B depicts a cross-section view illustrating the starting semiconductor substrate of FIG. 1A in a first orientation taken along line X-X. The starting semiconductor substrate 100 extends along a first axis (e.g. X-axis) to define length, a second axis (e.g., Y-axis) orthogonal to the X-axis to define a width, and a third axis orthogonal to the first and second axes to define a height.

The starting semiconductor substrate 100 includes a substrate base 102 and a semiconductor stack 104 formed on an upper surface of the substrate base 102. The substrate base 102 includes an etch stop layer 106 embedded between a lower base portion 108 and an upper base portion 110. The substrate base 102 (including the lower and upper base portions) can be formed from a semiconductor material such as, for example, silicon (Si). The etch stop layer 106 can be formed from various oxide materials including, but not limited to, silicon oxide (SiO2). In some embodiments, the etch stop layer 106 can be formed from silicon germanium (SiGe). The etch stop layer 106 can have a thickness (e.g., in the Z-axis direction) ranging from about 5 nm to about 100 nm. The etch stop layer 106 can be utilized to set a depth or "height in the Z-axis direction" of a source/drain deep trench, which is described in greater detail below.

The semiconductor stack 104 includes an alternating stacked arrangement of sacrificial layers 112 and active semiconductor layers 114 and. In one or more non-limiting embodiments, the sacrificial layers 112 and the active semiconductor layers 114 can be formed as nanosheets, where the active semiconductor layers 114 can serve as channel layers as described herein. Although three active semiconductor layers 114 are shown, more or fewer active semiconductor layers 114 can be used, and the number of sacrificial layers 112 will be increased or decreased accordingly.

In one or more non-limiting embodiments, the starting semiconductor substrate 100 may further include a bottom sacrificial layer 116 interposed between the substrate base 102 and the semiconductor stack 104. The bottom sacrificial layer 116 could later be transformed to a bottom dielectric isolation (BDI) layer, which serves to reduce, or even completely remove, a problem referred to as "half-sheet", which creates a potential leakage path between source and drain regions (not shown in FIG. 1) when the bottom sacrificial layer is omitted.

The bottom sacrificial layer 116 is a material that can be removed (e.g., etched) without etching the layers in the semiconductor stack 104. In other words, the bottom sacrificial layer 116 is formed from a material that can be removed without removing the active semiconductor layers 114 and sacrificial layers 112. In one or more non-limiting embodiments, the layer 116 includes silicon germanium (SiGe). To facilitate etching of the bottom sacrificial layer 116 without damaging the semiconductor layers 114 and the sacrificial layers 112, the bottom sacrificial layer 116 can be $SiGe_y$ % where the atomic percent % for "y" ranges from 50-70% atomic percent. Particularly, y in $SiGe_y$ % of the layer 116 can be about (or at least) 60% atomic percent such that the layer 116 can be etched without etching the sacrificial layers 112 and the active semiconductor layers 114.

In one or more non-limiting embodiments, the sacrificial layers 112, the active semiconductor layers 114, and the bottom sacrificial layer 116 can be epitaxially grown. The material of the sacrificial layers 112 can include $SiGe_x$ %, for example, where the atomic percent % for "x" ranges from about 15-35% atomic percent (i.e., x is less than y). The material of the active semiconductor layers 114 can include, for example, Si. The thickness or height (e.g., along the Z-axis) (e.g., along the Z-axis) of the bottom sacrificial layer 116 can range from about 5 nm to 15 nm, the thickness or height of each sacrificial layer 112 can be range from about 5 nm to 15 nm, and the thickness or height H3 of each active semiconductor layer 114 and the can range from about 5 nm to 15 nm.

Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on non-crystalline surfaces such as silicon dioxide or silicon nitride.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2A:
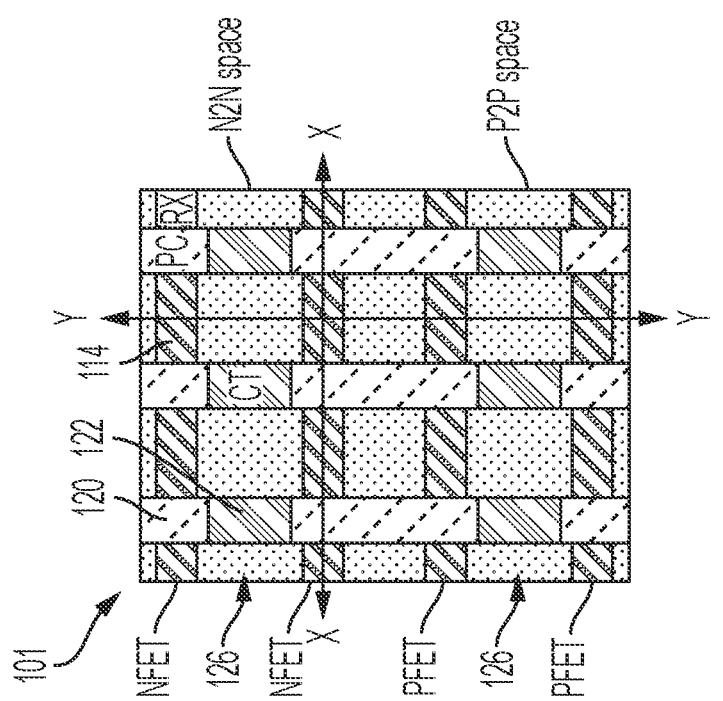
FIG. 2A is a top view of a semiconductor device after applying various fabrication processes on the starting substrate illustrated in FIGS. 1A and 1B.
Figure 2C:
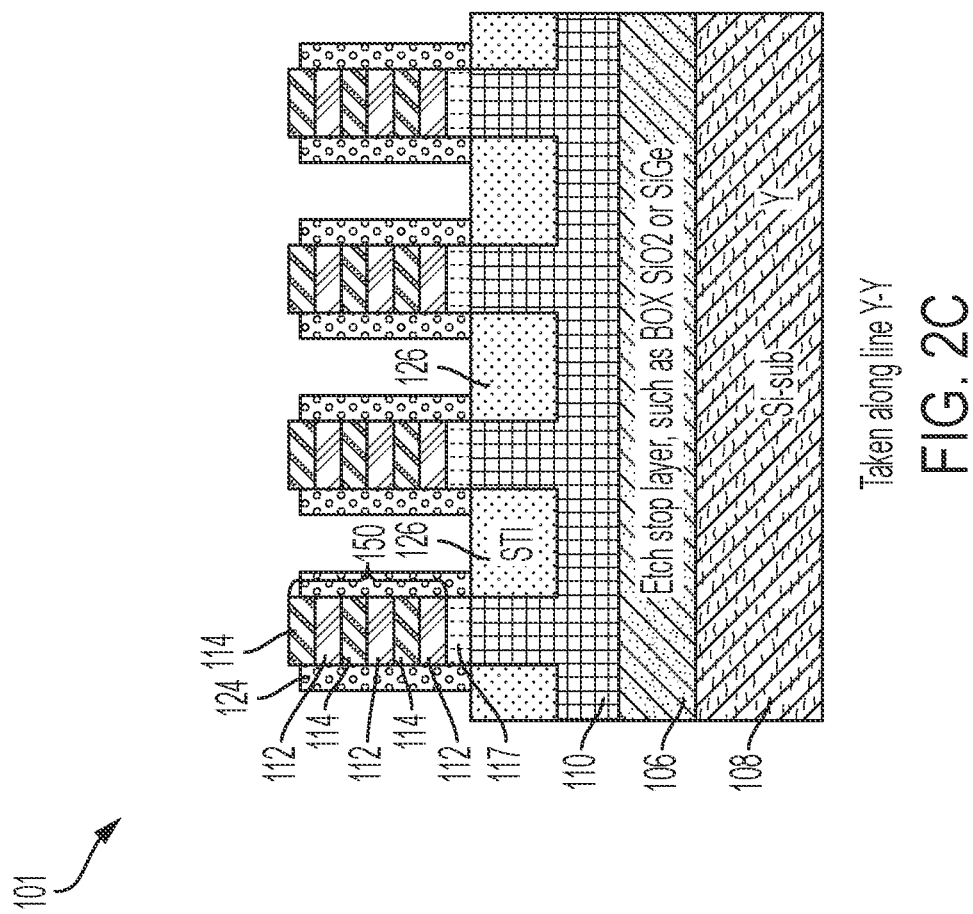
FIG. 2C is a cross-section view of the semiconductor device shown in FIG. 2A in a second orientation taken along line Y-Y.

Turning to FIGS. 2A, 2B and 2C, the starting substrate 100 is illustrated after performing various fabrication processes to form a semiconductor device 100 in an intermediate stage. As described herein, a semiconductor device in an intermediate stage refers a semiconductor device in a stage of fabrication prior to a final stage.

The fabrication processes include depositing a hard mask layer (not shown) over the semiconductor stack 104 and the hard mask layer and the semiconductor stack 104 are etched to define a nanosheet stack 150. Thereafter, shallow trench isolation (STI) 126 regions are formed by overfilling the trenches with dielectric material followed by CMP and dielectric recess, and the hardmask layer is removed.

With continued reference to FIGS. 2A, 2B and 2C, a dummy gate 120 is deposited and patterned. The dummy gate 120 is formed over the nanosheet stack 150, a gate cap 122 is formed on an upper surface of the dummy gate 120.

In one or more non-limiting embodiments of the invention, the dummy gate 120 represents a combination of a thin layer of gate oxide (e.g., SiO2) and a dummy gate material (e.g., amorphous silicon (a-Si)) from which the dummy gates 120 are formed. It should be appreciated that various known fabrication operations (e.g., an RIE) can be used to form dummy gates 120. In embodiments of the invention, the dummy gates 120 can be formed by depositing and planarizing a layer of dummy gate material (not shown) over a gate oxide (not shown separately from the active semiconductor layer 114). In some embodiments of the invention, the dummy gate material can be polycrystalline Si. In some embodiments of the invention, the dummy gate material can be amorphous Si (a-Si). After being deposited, the dummy gate material is planarized (e.g., by CMP) to a desired level.

Still referring to FIGS. 2A, 2B and 2C, various known semiconductor fabrication operations can be used to form the gate caps 122 on the upper surface of the dummy gate 120. The pattern used to form the gate caps 122 defines the footprint of the underlying dummy gates 120. In embodiments of the invention, the gate caps 122 can be formed from oxide and/or nitride materials. In embodiments of the invention, the gate caps 122 can be formed by depositing a layer of hard mask material and patterning then etching the deposited hard mask layer to form the gate caps 122. The dummy gate material is selectively etched such that portions of the dummy gate material that are not under the gate caps 122 are selectively removed, thereby forming the dummy gates 120 over the nanosheet stack 150.

With continued reference to FIGS. 2A, 2B and 2C, known fabrication operations can be used to selectively remove the portions of the gate oxide (not shown) that are not under the dummy gates 120, and a dilute hydrofluoric acid (DHF) cleaning process has is performed to ensure that all of the gate oxide that is not under the dummy gates 120 is removed. Thereafter, the exposed bottom sacrificial layer 116 is selectively removed (e.g., using a dry HCl etch).

Referring still to FIGS. 2A, 2B and 2C, known fabrication operations can be used to deposit a dielectric material used to form the gate spacers 124 on sidewalls of the dummy gates 120 and the gate caps 122, and filling the cavities after removal of bottom sacrificial layer 116 to form the BDI layer 117. In some embodiments of the invention, the gate spacers 124 can be formed by depositing the dielectric material over the dummy gates 120 and the gate caps 122, and then directionally etching (e.g., using an RIE) the dielectric material to form the gate spacers 124. In embodiments of the invention, the gate spacers 124 can be formed from any suitable dielectric material including, for example, silicon oxide, silicon nitride, silicon oxynitride, SiBCN, SiOCN, SiOC, or any suitable combination of those materials. In some embodiments of the invention, the gate spacers 124 can be a low-k dielectric material.

Figure 3B:
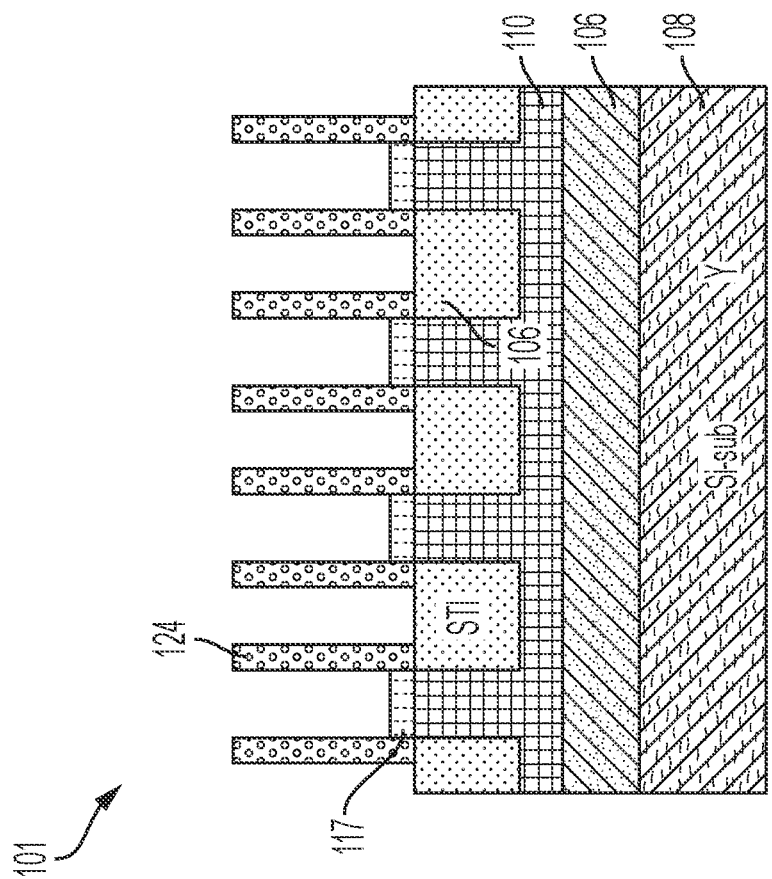
FIG. 3B is a cross-section view illustrating the semiconductor device of FIG. 3A in the second orientation.
Figure 3A:
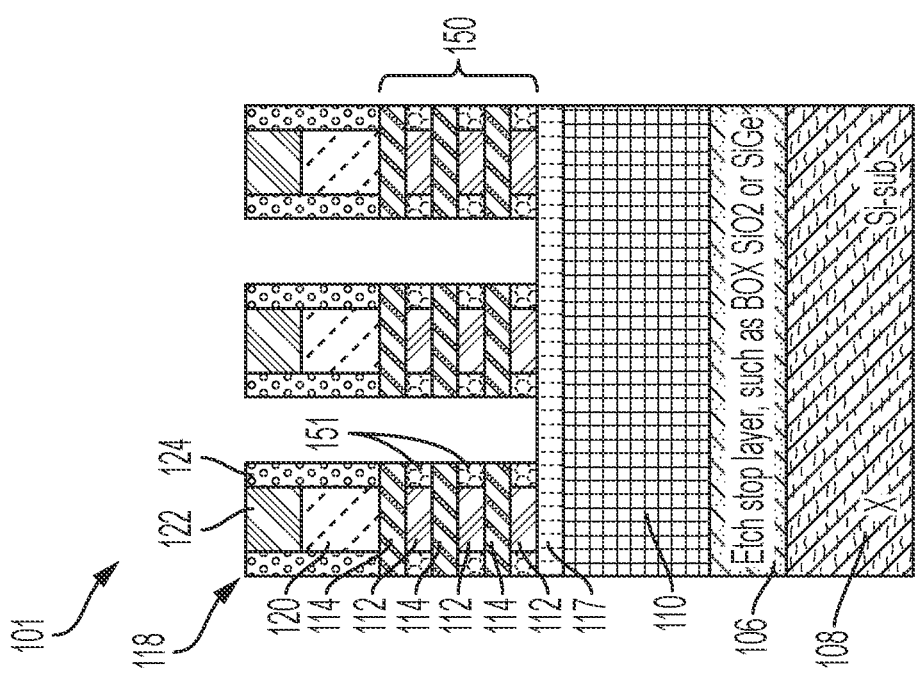
FIG. 3A is a cross-section view illustrating the semiconductor device in the first orientation following one or more subsequent fabrication processes.

Turning now FIGS. 3A and 3B, the semiconductor device 101 is illustrated after performing one or more fabrication processes on the nanosheet stack 150. The fabrications process include partially removing end regions of the sacrificial nanosheets 112 (previously referred to as sacrificial layers 112 prior to forming the nanosheet stack 150) to form end region or inner spacer cavities (not shown). In embodiments of the invention, the end regions of the sacrificial nanosheets 112 can be removed using a technique referred to as a "pull-back process" to pull back the sacrificial nanosheets 112 to an initial pull-back distance such that the ends of SiGe sacrificial nanosheets 112 terminate at about an inner edge of the gate spacers 124. In embodiments of the invention, the pull-back process leverages material properties of the sacrificial nanosheets 112, which in this example are formed from SiGe and therefore can be selectively etched with respect to the active semiconductor nanosheets 114 (previously referred to as active semiconductor layers 112 prior to forming the nanosheet stack 150) using, for example, a vapor phase hydrogen chloride (HCl) gas isotropic etch process.

Still referring to FIGS. 3A and 3B, a layer of inner spacer material (not shown) is conformally deposited over the nanosheet-based structure 100 using, for example, an atomic layer deposition (ALD) process. The inner spacer layer can be silicon nitride, silicoboron carbonitride, silicon carbonitride, silicon carbon oxynitride, or any other type of dielectric material (e.g., a dielectric material having a dielectric constant k of less than about 5). An isotropic etch back process, for example, can then be performed remove the inner spacer material everywhere except the cavities regions created by SiGe indentation. Accordingly, the portions of the inner space material filling the inner spacer cavities are maintained to form inner spacers 151 and the upper surfaces of the isolation regions 126 are exposed.

With continued reference to FIG. 3B, the semiconductor device 101 is shown with portions of the nanosheet stack 150 located in designated source/drain regions of the semiconductor device 101. In one or more non-limiting embodiments, a RIE process can be performed to etch portions of the nanosheet stack 150 that are not covered by the hard mask elements 118. Accordingly, portions of the BDI layer 116 located in the designated source/drain regions are exposed.

Figure 4B:
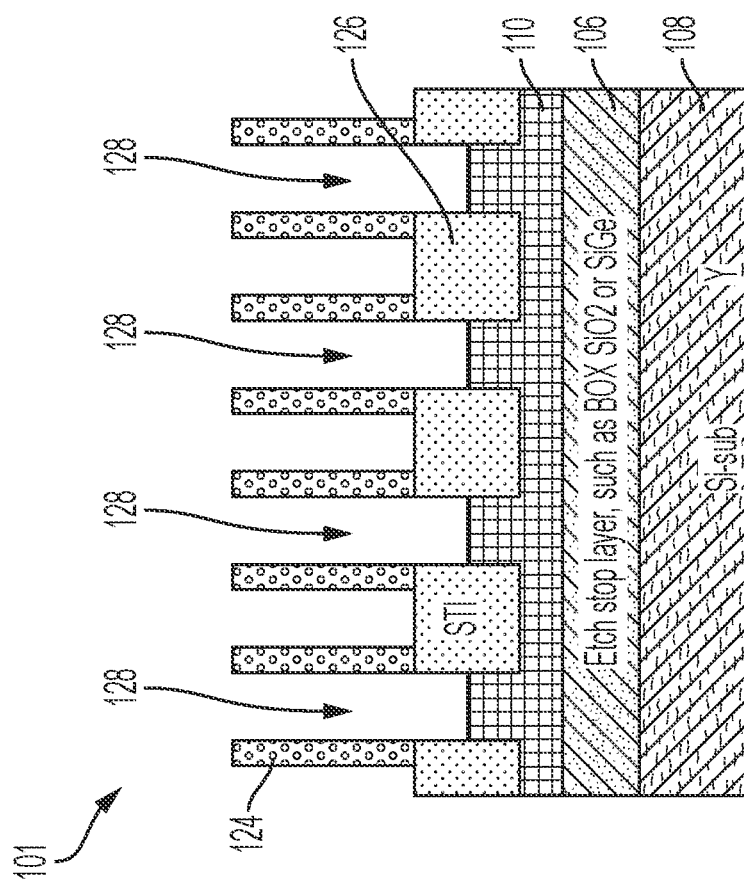
FIG. 4B is a cross-section view illustrating the semiconductor device of FIG. 4A in the second orientation.
Figure 4A:
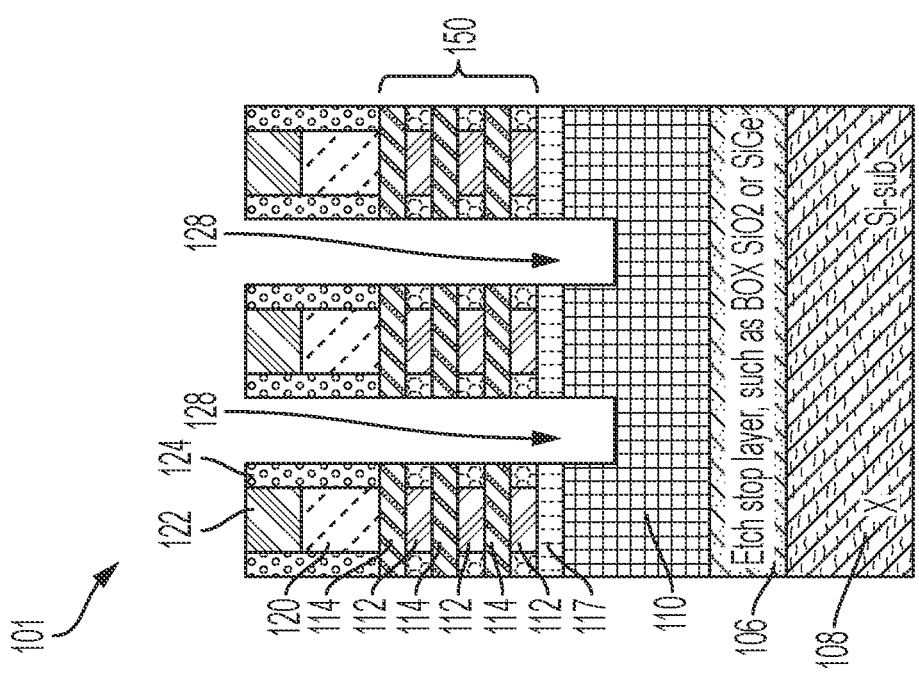
FIG. 4A is a cross-section view illustrating the semiconductor device in the first orientation following one or more subsequent fabrication processes.

Turning now to FIGS. 4A and 4B, the semiconductor device 101 is illustrated after forming source/drain trenches 128 in the base substrate 102. In one or more non-limiting embodiments of the invention, the timing of the RIE process used to form the source/drain trenches 128 can be extended to punch through the exposed portions of the BDI layer 116 such that the source/drain trenches 128 are extended in the base substrate 102. In one or more non-limiting embodiments of the invention, the source/drain trenches 128 are extended such that a bottom of the source/drain trenches is located below the portion of the BDI layer 116 and base substrate 102 covered by the hard mask elements 118.

Figure 5B:
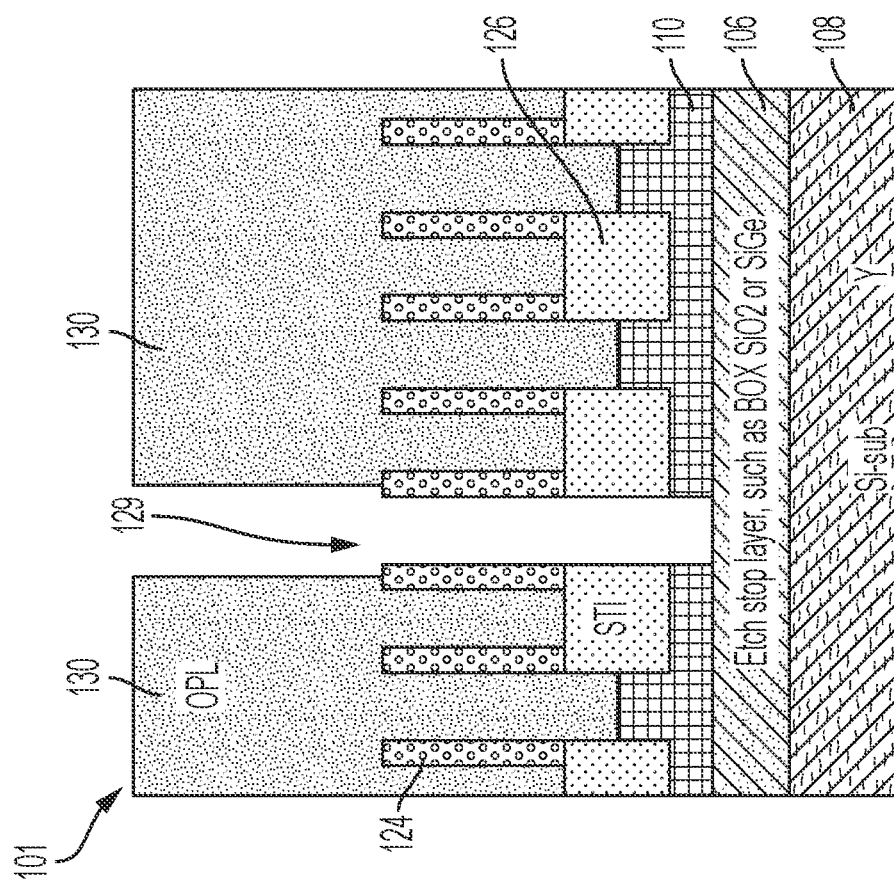
FIG. 5B is a cross-section view illustrating the semiconductor device of FIG. 5A in the second orientation.
Figure 5A:
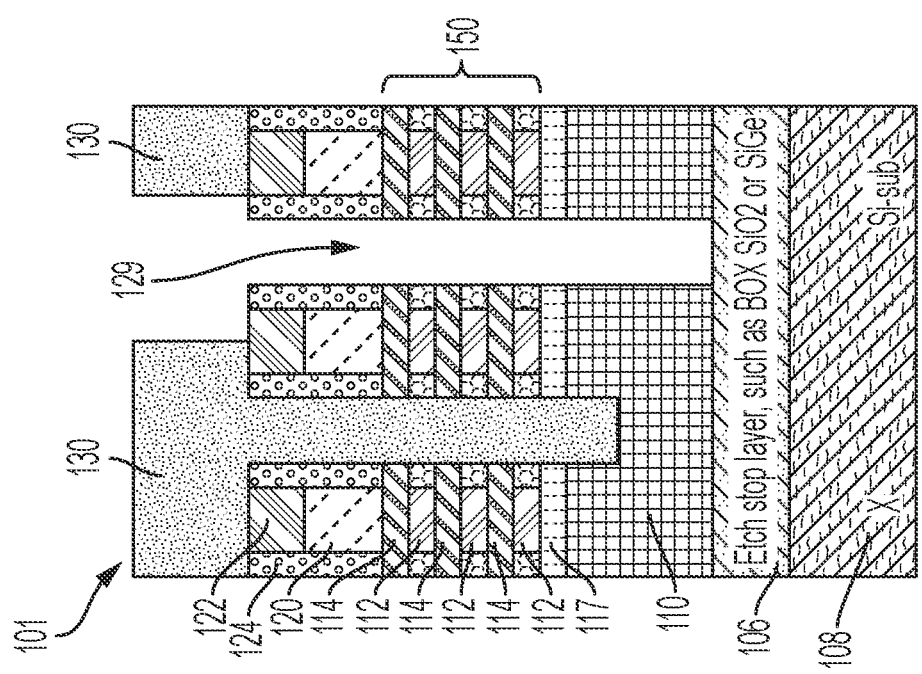
FIG. 5A is a cross-section view illustrating the semiconductor device in the first orientation following one or more subsequent fabrication processes.

Turning now to FIGS. 5A and 5B, one or more of the source/drain trenches are further extended into the base substrate 102 to form a source/drain deep trench 129. In one or more non-limiting embodiments, the source/drain deep trench 129 can be formed by depositing a pattern resist 130 on an upper surface of the semiconductor device 101 to cover the hard mask elements 118 and fill the source/drain trenches 128. The pattern resist 130 can then be patterned using known lithography and patterning techniques such that a targeted source/drain trench 129 is exposed, while remaining portions of the semiconductor device 101 remain covered. In one or more non-limiting embodiments, the pattern resist 130 includes an organic planarization layer (OPL) material, which facilitate patterning the pattern resist 130 with respect to remaining portions of the semiconductor device 101.

With continued reference to FIGS. 5A and 5B, the exposed targeted source/drain trench 129 is then further recessed using a RIE process, for example, to increase its depth below the covered source/drain trench 128. In one or more non-limiting embodiments, the RIE processed is performed to increase the depth of the targeted source/drain trench 129 until stopping on the etch stop layer 106. Accordingly, the etch stop layer 106 can be utilized to set the depth or the "height in the Z-axis direction," of the source/drain deep trench 129.

Figure 6B:
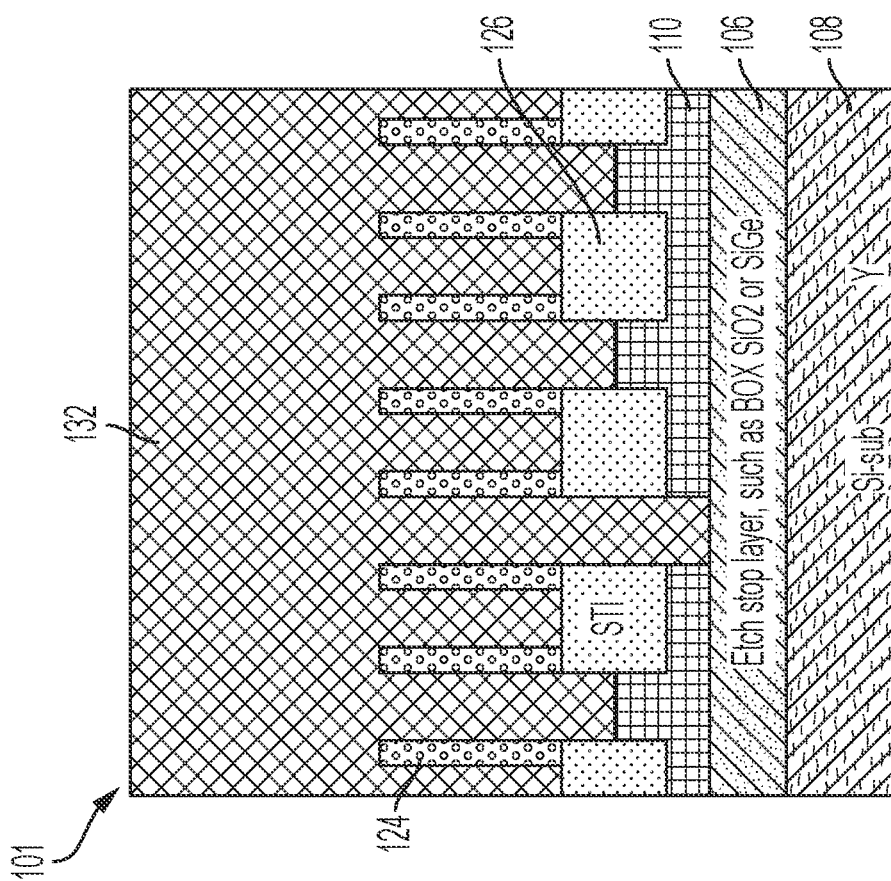
FIG. 6B is a cross-section view illustrating the semiconductor device of FIG. 6A in the second orientation.
Figure 6A:
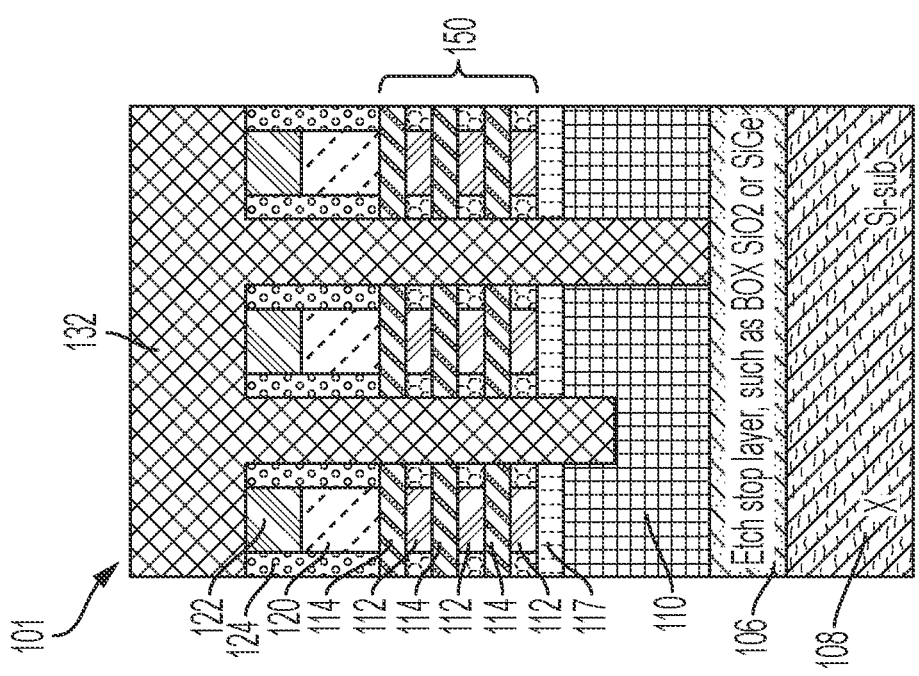
FIG. 6A is a cross-section view illustrating the semiconductor device in the first orientation following one or more subsequent fabrication processes.

Turning now to FIGS. 6A and 6B, the semiconductor device 101 is illustrated after filling the source/drain trench 128 and the source/drain deep trench 129 with a sacrificial placeholder material 132. The sacrificial placeholder material 132 can include various materials such as TiOx, AlOx, SiC, SiN/SiO2, SiGe, III-V materials, etc., which can be deposited by conventional technique such as CVD, PVD, ALD, etc.

Referring now to FIGS. 7A and 7B, the semiconductor device 101 is illustrated after recessing the sacrificial placeholder material 132 deposited in the filling the source/drain trench 128 and the source/drain deep trench 129. The sacrificial placeholder material 132 can be recessed (e.g., using a dry etch or wet etch process) until the recessed surface of the placeholder material disposed in the source/drain trenches 128 and the deep trench 129 reach a targeted depth below the nanosheet stacks 150. Accordingly, placeholder elements 134 are formed in the source/drain trenches 128 and a deep trench placeholder element 136 is formed in the source/drain deep trench 129.

In one or more non-limiting embodiments of the invention, the targeted depth is such that the recessed surface of the placeholder material 132 is aligned, or substantially aligned, with the upper surface of the upper base portion 110 of the substrate 102. In some non-limiting embodiments of the invention, the targeted depth is such that the recessed surface of the placeholder material 132 is above the upper surface of the upper base portion 110. For example, the sacrificial placeholder material 132 can be recessed such that its recessed surface is aligned, or substantially aligned, with the upper surface of the BDI layer 116.

In any case, the deep trench placeholder element 136 formed in the deep trench 129 has a larger height H1 (e.g., extends into the substrate 102 at a greater depth) with respect to a height H2 of the placeholder elements 134 formed in the source/drain trench due to the increased depth of the deep trench. However, the upper surfaces of the placeholder elements 134 located in the source/drain trench 128 are aligned, or substantially aligned (e.g., along the X-axis and Y-axis), with the upper surface of the deep trench placeholder element 136 located in the source/drain deep trench 129 because the sacrificial placeholder material 132 deposited in the source/drain trench 128 and the source/drain deep trench 129 are recessed together at the same time. The aligned upper surfaces of the placeholder elements 134 and 136 therefore facilitate the uniform formation of epi grown source/drains as described in greater detail below.

Figure 8B:
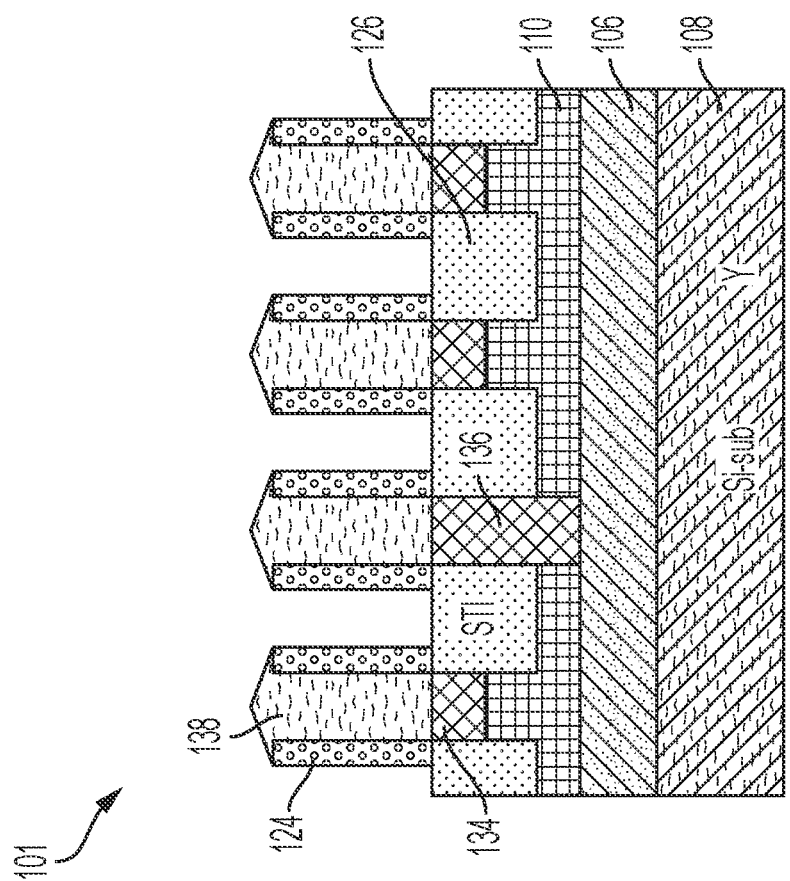
FIG. 8B is a cross-section view illustrating the semiconductor device of FIG. 8A in the second orientation.
Figure 8A:
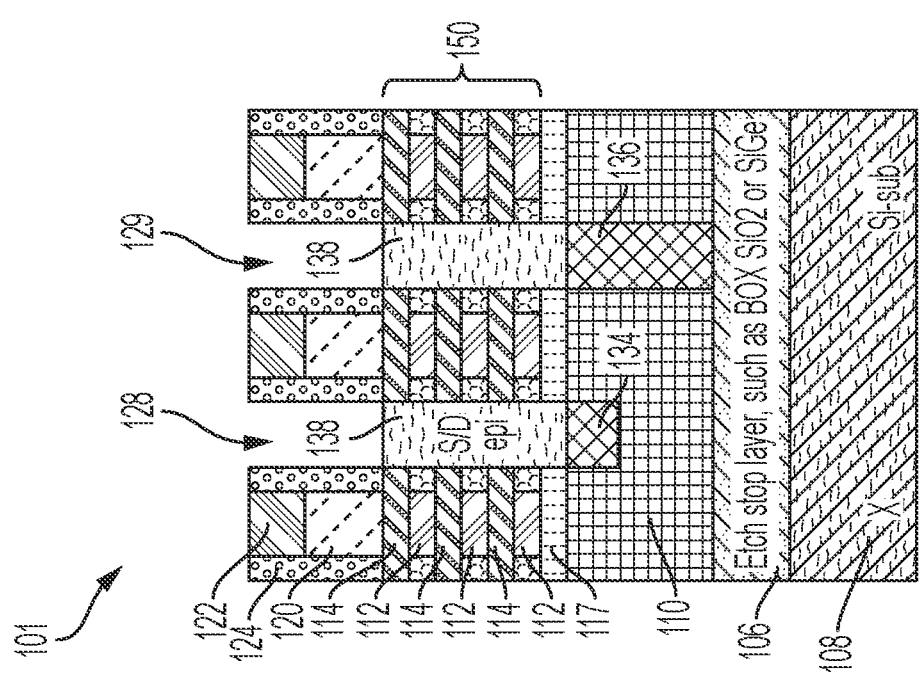
FIG. 8A is a cross-section view illustrating the semiconductor device in the first orientation following one or more subsequent fabrication processes.

Turning to FIGS. 8A and 8B, after forming source/drain elements 138 in the source/drain trench 128 and the source/drain deep trench 129. In one or more non-limiting embodiments, the source/drain elements 138 are formed by performing an epi growth process to grow a semiconductor material from the exposed semiconductor surfaces with upper surface of the placeholder elements 134 and 136 exposed. In one more non-limiting embodiments, the epi growth process can be performed until the epi materials reaches the upper surface of portions of the spacers 124 located in the designated source/drain regions. As further shown in FIGS. 8A, 8B, all the source/drain regions have similar exposed sidewall surfaces of nanosheets 114 and exposed bottom surfaces of sacrificial placeholder material 134/136, this facilitates uniform formation of the source/drain elements 138 due to the uniform surrounding materials.

Referring to FIGS. 9A and 9B, the semiconductor device 101 is illustrated after performing additional fabrication processes to complete one or more gates. The fabrication processes include depositing an interlayer dielectric (ILD) 140 on the semiconductor device 101 to cover the source/drain elements 138 and the nanosheet stacks 150, and then recessing the ILD 140 (e.g., using a CMP process) until stopping on an upper surface of the dummy gate 120 located in the designated gate regions.

With continued reference to FIGS. 9A and 9B, the dummy gate 120 can then be selectively removed to exposed the underlying nanosheet stack 150.

Once the nanosheet stack 150 is exposed, the sacrificial nanosheets 112 can be selectively removed with respect to the active nanosheets 114. In one or more non-limiting embodiments of the invention, an etching chemistry is chosen that etches the material of the sacrificial nanosheets 112 without attacking, or substantially attaching, the active nanosheets 114. In this manner, the active nanosheets 114 can be "released" (not shown).

With continued reference to FIGS. 9A and 9B, a gate 142 is formed to surround or "wrap around" the released active nanosheets 114. In one or more non-limiting embodiments, the gate 142 can be a high-k metal gate (HKMG) formed to surround the released active nanosheets 114 using, for example, known replacement metal gate (RMG) processes, or so-called gate-first processes. Accordingly, the released active nanosheets 114 serve as the "channel region" around which the gate 142 is formed, and through which a current passes from the source to the drain in the final device.

In one or more non-limiting embodiments, the gate 142 can include known gate dielectric(s) (not shown) and known work function metal stacks (not shown) appropriate for NFET or PFET devices. In some embodiments of the invention, the gate dielectric is a high-k dielectric film. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, one or more work function layers are positioned between the high-k dielectric film and a bulk gate material. In some embodiments of the invention, the gate 142 includes one or more work function layers, but does not include a bulk gate material.

If present, the work function layers can be made of, for example, aluminum, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify the work function of the gate 142 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness.

In some embodiments, the gate 142 includes a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

Turning now to FIGS. 10A and 10B, the semiconductor device 101 is illustrated after performing various middle-of-line (MOL) and backend-of-line (BEOL) fabrication processes. The MOL fabrication process includes forming one or more source/drain contacts 144 to enable electrical connection to the source/drain elements 138. The source/drain contacts 144 can be formed using known lithography and patterning techniques. For example, a mask layer (not shown) can be deposited on the upper surface of the ILD 140 and patterned to exposed portions of the ILD 140 designated to contain a respective source/drain contact 144. The exposed portions of the ILD 140 can then be etched to form source/drain contact trenches (not shown) that stop on an upper surface of the underlying source/drains 138. The source/drain contact trenches are then filled with an electrically conductive material and planarized (e.g. using CMP) to form the source/drain contacts 144. The electrically conductive material includes, for example, a silicide layer such as NiSi, TiSi or NiPtSi, and metal adhesion layers, such as TiN, and a conductive metal, such as W, Co, Ru, etc.

With continued reference to FIGS. 10A and 10B, BEOL interconnect layer 146 can be formed on an upper surface of ILD 140. The BEOL interconnect layer 146 can be formed with multiple layers of electrically conductive (e.g., copper (Cu)) wires and vias with low-k dielectrics filled in between. In one or more non-limiting embodiments, the BEOL interconnect layer 146 directly contacts the upper surface of the source/drain contacts 144. Accordingly, an electrical path is established from the BEOL interconnect layer 146 to the source/drain contacts 144. A carrier wafer 148 is then bonded on an upper surface of the BEOL interconnect layer 146. The carrier wafer can be include a Si substrate that is bonded to the upper surface of the BEOL interconnect layer 146 and serves to support the semiconductor device 101 when performing various backside fabrication processes discussed in greater detail below.

With reference to FIGS. 11A and 11B, the semiconductor device 101 is illustrated after being flipped (e.g., as indicated by the arrows) and recessing the lower base portion 108 until the etch stop layer 106 is exposed. In one or more non-limiting embodiments, a selective wet and/or dry etch process can be performed and stops in response to reaching the etch stop layer 106 and exposing the etch stop layer surface.

Turning to FIGS. 12A and 12B, the semiconductor device 101 is illustrated following removal of the etch stop layer 106 and upper base portion 110. In one or more non-limiting embodiments, selective wet and/or dry etch processes can be performed to remove the etch stop layer 106 and upper base portion 110. Accordingly, the source/drain placeholder elements 134 and the deep trench source/drain placeholder element 136 are exposed.

Referring now to FIGS. 13A and 13B, the semiconductor device 101 is illustrated after depositing a backside ILD 152 to cover and encapsulate the placeholder elements 134 and 136. Following deposition of the backside ILD 152, and CMP process can be performed to planarize the backside ILD 152. The CMP process can stop on an upper surface of the deep trench source/drain placeholder element 136.

Figure 14B:
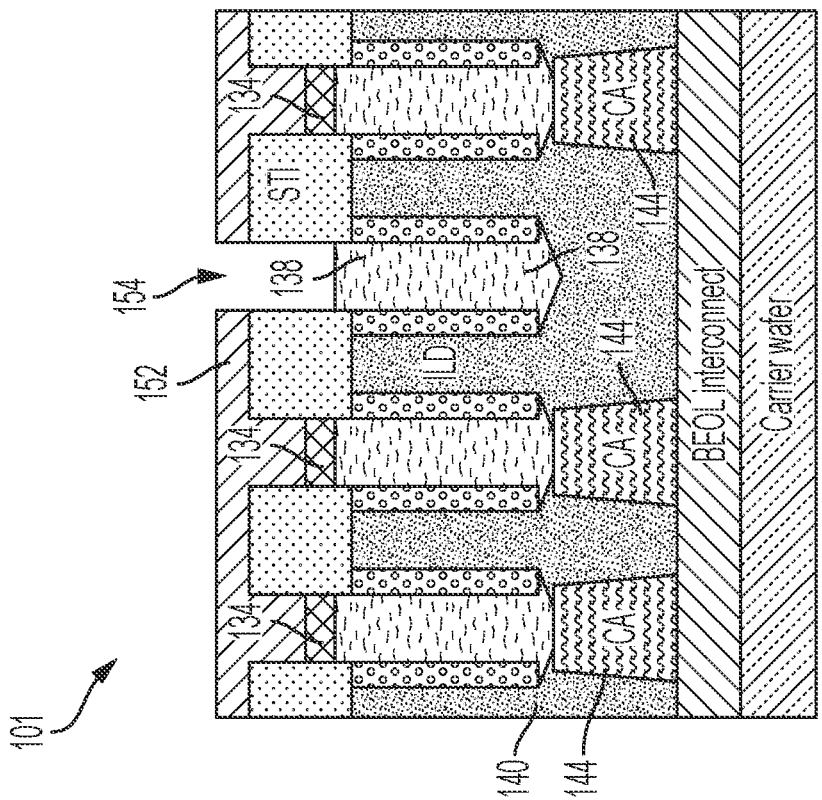
FIG. 14B is a cross-section view illustrating the semiconductor device of FIG. 14A in the second orientation.
Figure 14A:
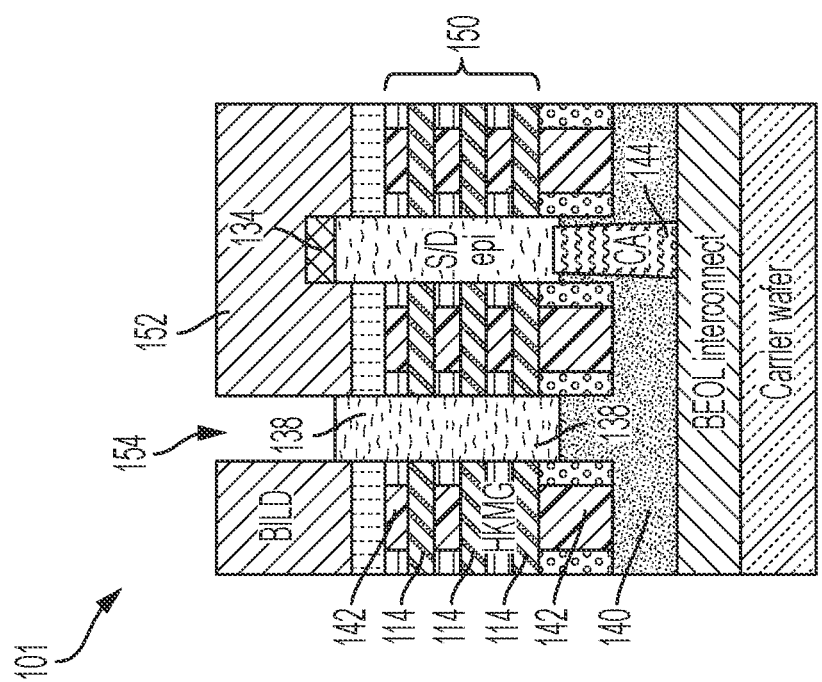
FIG. 14A is a cross-section view illustrating the semiconductor device in the first orientation following one or more subsequent fabrication processes.

Turning to FIGS. 14A and 14B, the semiconductor device 101 is illustrated following removal of the deep trench source/drain placeholder element 136. Accordingly, a backside trench 154 is formed in the backside ILD 152 and exposes a portion of the source/drain element 138. In one or more non-limiting embodiments, the deep trench source/drain placeholder element 136 is removed, while the source/drain placeholder elements 134 are maintained in the backside ILD 152 since the source/drain placeholder elements 134 do not require connection with a backside contact.

With reference to FIGS. 15A and 15B, an electrically conductive material is deposited in the backside trench 154 to establish physical contact and electrical connection with the source/drain element 138. The electrically conductive material can be similar material as 144 as described herein. In one or more non-limiting elements, the electrically conductive material over-fills the backside 154 and a CMP process is performed to planarize the upper surfaces of the electrically conductive material and the backside ILD 152. The remaining electrically conductive material filling the deep trench forms a backside contact 156, which establishes electrical connection with the underlying source/drain 138. In one or more non-limiting embodiments, the backside contact 156 will not extend beyond the BDI layer 156 as further shown in FIG. 15A. As described herein, the backside contact 156 can establish connection between a source/drain 138 and a backside power distribution network, while one or more of the source/drain contacts 144 serve as a frontside contact to establish connection between a source/drain 138 and a BEOL interconnect. According to one or more non-limiting embodiments, the backside contact 156 extends between a first source/drain 138 and the backside power distribution network 160 to define a contact height (e.g., extending along the Z-axis), and the placeholder 134 extends between a second source/drain 134 and the backside power distribution network 160 to define a placeholder height that is less than the contact height of the backside contact 156. In other words, the backside contact 156 has a depth (e.g. a height extending along the Z-axis) that is greater than a depth (e.g., height extending along the Z-axis) of the source/drain placeholder elements 134.

With reference now to FIGS. 16A and 16B, a backside interconnect 158 is formed to connect to backside contact 156. The backside electrically conductive layer 158 can be formed from a metal material such as copper, for example, and can serve as a backside power rail (BSPR). In one or more non-limiting embodiments, the backside electrically conductive layer 158 directly contacts the upper surface of the backside contact 156. Accordingly, an electrical path is established from the backside electrically conductive layer 158 (e.g., the backside power rail) to the backside contact 156.

With continued reference to FIGS. 16A and 16B, a backside power delivery network (BSPDN) 160 is formed on an upper surface of the electrically conductive layer 158. The BSPDN 160 includes dense microthrough silicon vias (μTSVs), along with a power and/or a ground metal stack(s) on the backside of the substrate 102. Accordingly, the backside electrically conductive layer 158 can serve as a backside power rail (BSPR) configured to provide power to the BSPDN 160. As described above, the process flow may allow for maintaining the source/drain placeholder elements 134 embedded in the backside ILD 152 following completion of the semiconductor device 101, and may also serve as a technical artifact indicating that the process flow described above was performed when fabricating the completed semiconductor device shown in FIGS. 16A and 16B.

FIGS. 17A and 17B illustrate a non-limiting embodiment of the invention where the sacrificial placeholder material 132 is recessed to a targeted depth to form placeholder elements 134 and 136 that extend beyond or "above" the upper surface of the upper base portion 110. Accordingly, the resulting backside contact 156 extends beyond the BDI layer 116 and the base of the gate to contact the source/drain contact 138 to establish electrical connection therewith as shown in FIGS. 18A and 18B.

As described herein, various non-limiting embodiments provide a semiconductor device that implements source/drain placeholder elements that improve epitaxy growth uniformity when forming the source/drains. The source/drain placeholder elements are formed in respective source/drain trenches prior to performing the source/drain epi process such that the bottom surfaces of all the source/drain trenches are aligned. In this manner, uniform source/drains can be formed following the source/drain epi process.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

Various descriptions may also refer to a "p-type" device and/or an "n-type device." A "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabrication a semiconductor device, the method comprising:
    patterning a semiconductor nanosheet stack formed on semiconductor substrate to define a channel region between a first designated source/drain region and a second designated source/drain region;
    forming a first source/drain trench in a first portion of the semiconductor substrate located in the first designated source/drain channel region and forming a second source/drain trench in a second portion of the semiconductor substrate located in the second designated source/drain channel region;
    extending a depth of the second source/drain trench to define a deep trench while maintaining a depth of the first source/drain trench;
    forming a placeholder element in the first source/drain trench and a deep trench placeholder element in the deep trench; and
    forming a first source/drain on the placeholder element and a second source/drain on the deep trench placeholder element,
    wherein the semiconductor substrate includes an etch stop layer interposed between a lower portion of the semiconductor substrate and an upper portion of the semiconductor substrate, and wherein extending a depth of the second source/drain trench further comprises etch-ing the upper portion of the semiconductor substrate until stopping on the etch stop layer to define the depth of the deep trench.

2. The method of claim 1, wherein forming the first and second placeholder elements comprises:
    filling the first source/drain trench and the deep trench with a placeholder material; and
    recessing the placeholder material until the upper surface of the placeholder material disposed in the first source/drain trench and the deep trench reach a targeted depth.

3. The method of claim 2, wherein the targeted depth forms a recessed surface of the placeholder material that is co-planar with an upper surface of the semiconductor substrate.

4. The method of claim 2, wherein the targeted depth forms a recessed surface of the placeholder material that is above an upper surface of the semiconductor substrate.

5. The method of claim 2, wherein forming a first source/drain and the second source/drain includes epitaxially growing the first source/drain from the placeholder element and epitaxially growing the second source/drain from the deep trench placeholder element.

6. The method of claim 1, further comprising replacing the deep trench placeholder element with a backside contact that establishes electrical connection with the second source drain.

7. The method of claim 6, further comprising forming a gate around the channel region.

8. The method of claim 7, wherein the backside contact is below a base of the gate.

9. The method of claim 7, wherein the backside contact extend above a base of the gate.

10. A semiconductor device comprising:
    a substrate extending along a first axis to define a length, a second axis orthogonal to the first axis to define a width, and a third axis orthogonal to the first and second axes to define a height;
    a nanosheet stack on the substrate, the nanosheet stack defining channels of the semiconductor device;
    a first source/drain on a first side of the nanosheet stack and a second source/drain on an opposing side of the nanosheet stack;
    a backside contact including a first contact end on a first end of the first source/drain and an opposing second contact end in electrical communication with a backside power distribution network;
    a frontside contact including a first contact end on a first end of the second source/drain and an opposing second contact end in electrical communication with a backend of line (BEOL) interconnect;
    a placeholder extending along the third axis from an opposing second end of the second source/drain, the placeholder having a height that is less than a height of the backside contact.

11. The semiconductor device of claim 10, wherein the first source/drain extends along the third axis to define a first source/drain height and the second source/drain extends along the third axis to define a second source/drain height matching the first source/drain height.

12. The semiconductor device of claim 10, wherein the backside contact extends along the third axis between the first source/drain and the backside power distribution network to define a contact height, and wherein the placeholder extends between the second source/drain and the backside power distribution network to define a placeholder height.

13. The semiconductor device of claim 12, wherein the placeholder height is less than the contact height.

14. A semiconductor device comprising:
a substrate extending along a first axis to define a length, a second axis orthogonal to the first axis to define a width, and a third axis orthogonal to the first and second axes to define a height;
a nanosheet stack on the substrate, the nanosheet stack including a plurality of individual nanosheets defining channels of the semiconductor device;
a gate stack on the substrate and wrapping around the individual nanosheets;
a first source/drain on a first side of the nanosheet stack and a second source/drain on an opposing side of the nanosheet stack;
a backside contact extending from a first contact end in electrical communication with a backside power distribution network to a second contact end located completely below the gate stack and contacting the first source/drain;
a frontside contact extending from a first contact end in electrical communication with a backend of line (BEOL) interconnect to an opposing second contact end contacting a first end of the second source/drain; and
a placeholder extending along the third axis from a first end to an opposing second end located below the gate stack and contacting an opposing second end of the second source/drain.

15. The semiconductor device of claim 14, wherein the first source/drain extends along the third axis to define a first source/drain height and the second source/drain extends along the third axis to define a second source/drain height matching the first source/drain height.

16. The semiconductor device of claim 15, wherein the backside contact extends along the third axis between the first source/drain and the backside power distribution network to define a contact height.

17. The semiconductor device of claim 16, wherein the placeholder extends between the second source/drain and the backside power distribution network to define a placeholder height.

18. The semiconductor device of claim 17, wherein the placeholder height is less than the contact height.

* * * * *